(12) United States Patent
Yasuda

(10) Patent No.: US 12,190,983 B2
(45) Date of Patent: Jan. 7, 2025

(54) VOLTAGE GENERATION CIRCUIT

(71) Applicant: KIOXIA CORPORATION, Tokyo (JP)

(72) Inventor: Takaya Yasuda, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 64 days.

(21) Appl. No.: 17/898,841

(22) Filed: Aug. 30, 2022

(65) Prior Publication Data

US 2023/0186955 A1    Jun. 15, 2023

(51) Int. Cl.
  *G11C 5/14*    (2006.01)
  *G05F 3/26*    (2006.01)

(52) U.S. Cl.
  CPC ............. *G11C 5/147* (2013.01); *G05F 3/262* (2013.01)

(58) Field of Classification Search
  CPC .................................. G11C 5/147; G05F 3/262
  See application file for complete search history.

(56) References Cited

U.S. PATENT DOCUMENTS

| | | | |
|---|---|---|---|
| 6,452,437 B1 * | 9/2002 | Takeuchi | G11C 11/5621 327/541 |
| 9,671,812 B2 * | 6/2017 | Madan | G05F 3/262 |
| 10,061,340 B1 | 8/2018 | Rao et al. | |
| 2004/0207380 A1 | 10/2004 | Ariki | |

FOREIGN PATENT DOCUMENTS

| | | |
|---|---|---|
| JP | 2004-318235 A | 11/2004 |
| JP | 4479309 B2 | 6/2010 |

* cited by examiner

*Primary Examiner* — Vanthu T Nguyen
(74) *Attorney, Agent, or Firm* — Kim & Stewart LLP

(57) ABSTRACT

A voltage generation circuit generates a first current having a first temperature-dependent characteristic in which a current value thereof changes with a predetermined change in temperature, and a second current having a second temperature-dependent characteristic different from the first temperature-dependent characteristic. The voltage generation circuit includes a first variable resistor and a second variable resistor connected in series. The second current flows through the first variable resistor, and a third current having a current value that is based on a difference between a current value of the first current and a current value of the second current, flows through the second variable resistor.

8 Claims, 18 Drawing Sheets

VOLTAGE GENERATION CIRCUIT

CROSS-REFERENCE TO RELATED APPLICATION(S)

This application is based upon and claims the benefit of priority from Japanese Patent Application No. 2021-202823, filed Dec. 14, 2021, the entire contents of which are incorporated herein by reference.

FIELD

Embodiments described herein relate generally to a voltage generation circuit.

BACKGROUND

A semiconductor device may include an element whose characteristic varies depending on a temperature. In order to compensate for a temperature-dependent characteristic of such an element, a voltage generation circuit capable of adjusting the temperature-dependent characteristic is required.

DETAILED DESCRIPTION

Figure 1:
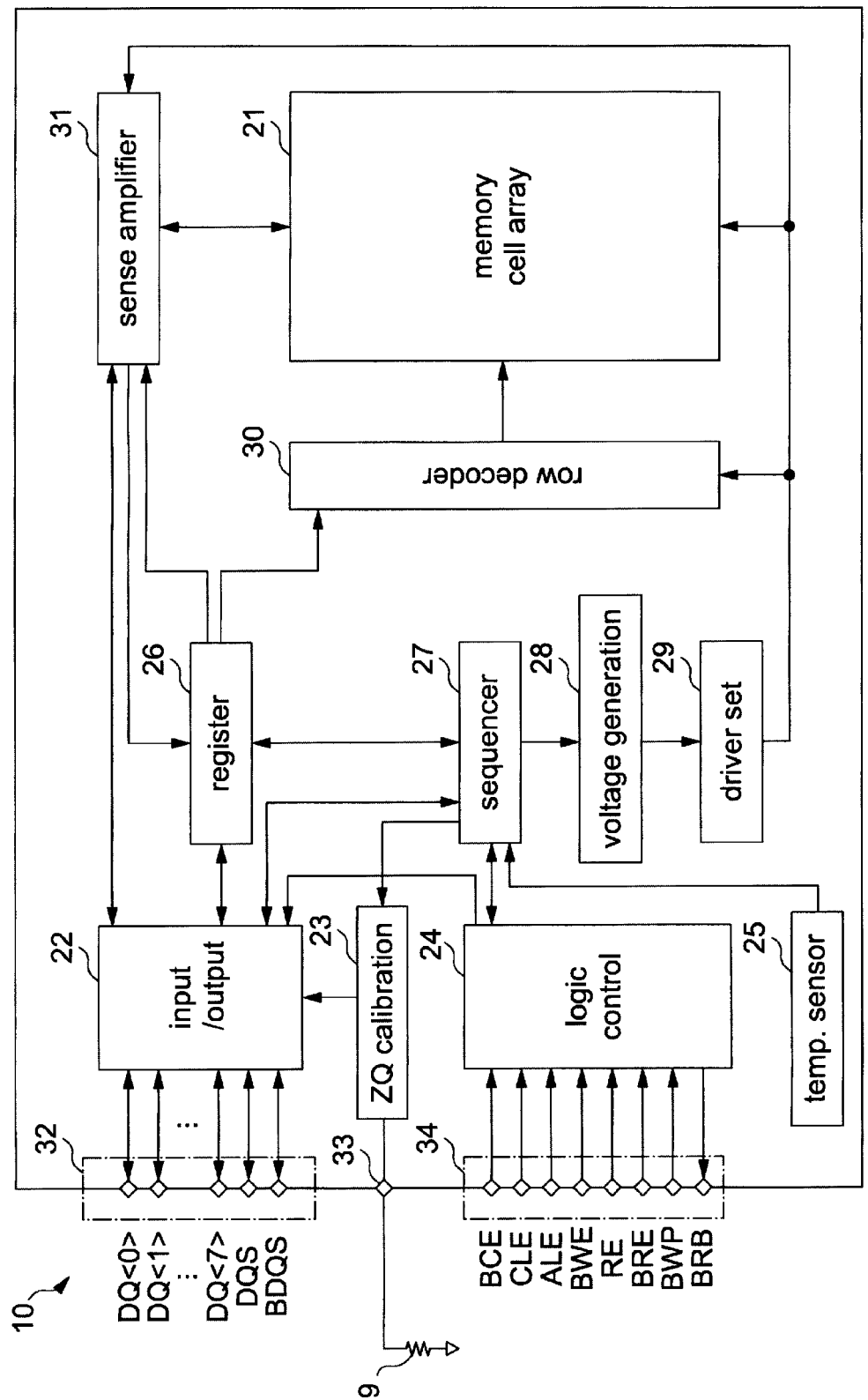
FIG. 1 is a block diagram showing a configuration of a semiconductor memory device according to embodiments.

Embodiments provide a voltage generation circuit in which temperature-dependent characteristics are adjusted.

In general, according to one embodiment, a voltage generation circuit generates a first current indicating a first temperature-dependent characteristic in which a current value thereof changes with a predetermined change in temperature, and a second current indicating a second temperature-dependent characteristic different from the first temperature-dependent characteristic. The voltage generation circuit includes a first variable resistor and a second variable resistor connected in series. The second current flows through the first variable resistor, and a third current having a current value that is based on a difference between a current value of the first current and a current value of the second current, flows through the second variable resistor.

Hereinafter, a voltage generation circuit according to an embodiment will be described in detail with reference to the drawings. In the following description, elements having substantially the same functions and configurations are denoted by the same reference numerals, and the description will be repeated only when necessary. Each embodiment described below exemplifies an apparatus and a method for embodying the technical idea of this embodiment. The technical idea of the embodiments is not limited to the material, shape, structure, arrangement, and the like of the elements described later. The technical idea of the embodiments may be obtained by adding various modifications to the scope of the claims.

The following embodiments may be combined with one another as long as no technical contradiction occurs.

1. First Embodiment

A memory system in which a voltage generation circuit according to the embodiments is implemented will be described with reference to FIG. 1. The memory system includes, for example, a nonvolatile memory, which is a semiconductor memory device, and a memory controller that controls the nonvolatile memory.

1-1. Configuration of Semiconductor Memory Device

A configuration example of a semiconductor memory device according to the first embodiment will be described with reference to FIG. 1. As shown in FIG. 1, a semiconductor memory device 10 includes a memory cell array 21, an input/output circuit 22, a ZQ calibration circuit 23, a logic control circuit 24, a temperature sensor 25, a register 26, a sequencer 27, a voltage generation circuit 28, a driver set 29, a row decoder 30, a sense amplifier 31, an input/output pad group 32, a ZQ calibration pad 33, and a logic control pad group 34.

The memory cell array 21 includes a plurality of non-volatile memory cells associated with word lines and bit lines.

The input/output circuit 22 transmits and receives data signals (DQ<0> to DQ<7>), a data strobe signal (DQS), and an inversion signal (BDQS) thereof to and from the memory controller. The input/output circuit 22 transmits commands and addresses in the data signals to the register 26. The input/output circuit 22 transmits and receives write data and read data to and from the sense amplifier 31.

The ZQ calibration circuit 23 calibrates an output impedance of the semiconductor memory device 10 based on a reference resistance via the ZQ calibration pad 33.

The logic control circuit 24 receives, for example, a chip enable signal (BCE), a command latch enable signal (CLE), an address latch enable signal (ALE), a write enable signal (BWE), a read enable signal (RE), an inversion signal (BRE) of the read enable signal, and a write protect signal (BWP) from the memory controller. The logic control circuit 24 transmits a ready busy signal (BRB) to the memory controller to notify a state of the semiconductor memory device 10 to the outside.

The temperature sensor 25 has a function of measuring a temperature inside the semiconductor memory device 10. The temperature sensor 25 transmits information on the measured temperature to the sequencer 27. The temperature sensor 25 is provided at any location inside the semiconductor memory device 10 within a range in which a temperature that can be deemed to be a temperature of the memory cell array 21 can be measured.

The register 26 stores the commands and the addresses. The register 26 transmits the addresses to the row decoder 30 and the sense amplifier 31, and transmits the commands to the sequencer 27.

The sequencer 27 receives the commands and controls the entire semiconductor memory device 10 according to a sequence based on the received commands. The sequencer 27 transmits information on the temperature received from the temperature sensor 25 to the memory controller via the input/output circuit 22.

The voltage generation circuit 28 generates, based on an instruction from the sequencer 27, a voltage necessary for operations on data such as a write operation, a read operation, and an erase operation. Details will be described later, and the voltage generation circuit 28 generates an appropriate voltage with respect to the temperature measured by the temperature sensor 25 when generating the voltage. The voltage generation circuit 28 supplies the generated voltage to the driver set 29.

The driver set 29 includes a plurality of drivers, and supplies the voltage from the voltage generation circuit 28 to the row decoder 30 and the sense amplifier 31 based on the addresses from the register 26. The driver set 29 supplies the voltage to the row decoder 30 based on, for example, a row address in the addresses.

The row decoder 30 receives the row address in the addresses from the register 26, and selects a row of memory cells based on the row address. The voltage from the driver set 29 is applied to the selected row of memory cells via the row decoder 30.

At the time of a data read operation, the sense amplifier 31 senses read data read from a memory cell to a bit line, and transmits the sensed read data to the input/output circuit 22. At the time of a data write operation, the sense amplifier 31 transmits write data written via the bit line to the memory cell. The sense amplifier 31 receives a column address in the addresses from the register 26, and outputs a column of data based on the column address.

The data signals DQ<0> to DQ<7>, the signal DQS, and the signal BDQS received from the memory controller are transmitted to the input/output circuit 22 via the input/output pad group 32. The data signals DQ<0> to DQ<7> transmitted from the input/output circuit 22 are transmitted to the outside of the semiconductor memory device 5 via the input/output pad group 32.

One end of the ZQ calibration pad 33 is connected to the reference resistance, and the other end thereof is connected to the ZQ calibration circuit 23.

The signals BCE, CLE, ALE, BWE, RE, BRE, and BWP received from the memory controller are transmitted to the logic control circuit 24 via the logic control pad group 34. The signal BRB transmitted from the logic control circuit 24 is transmitted to the memory controller via the logic control pad group 34.

1-2. Configuration of Voltage Generation Circuit

Figure 2:
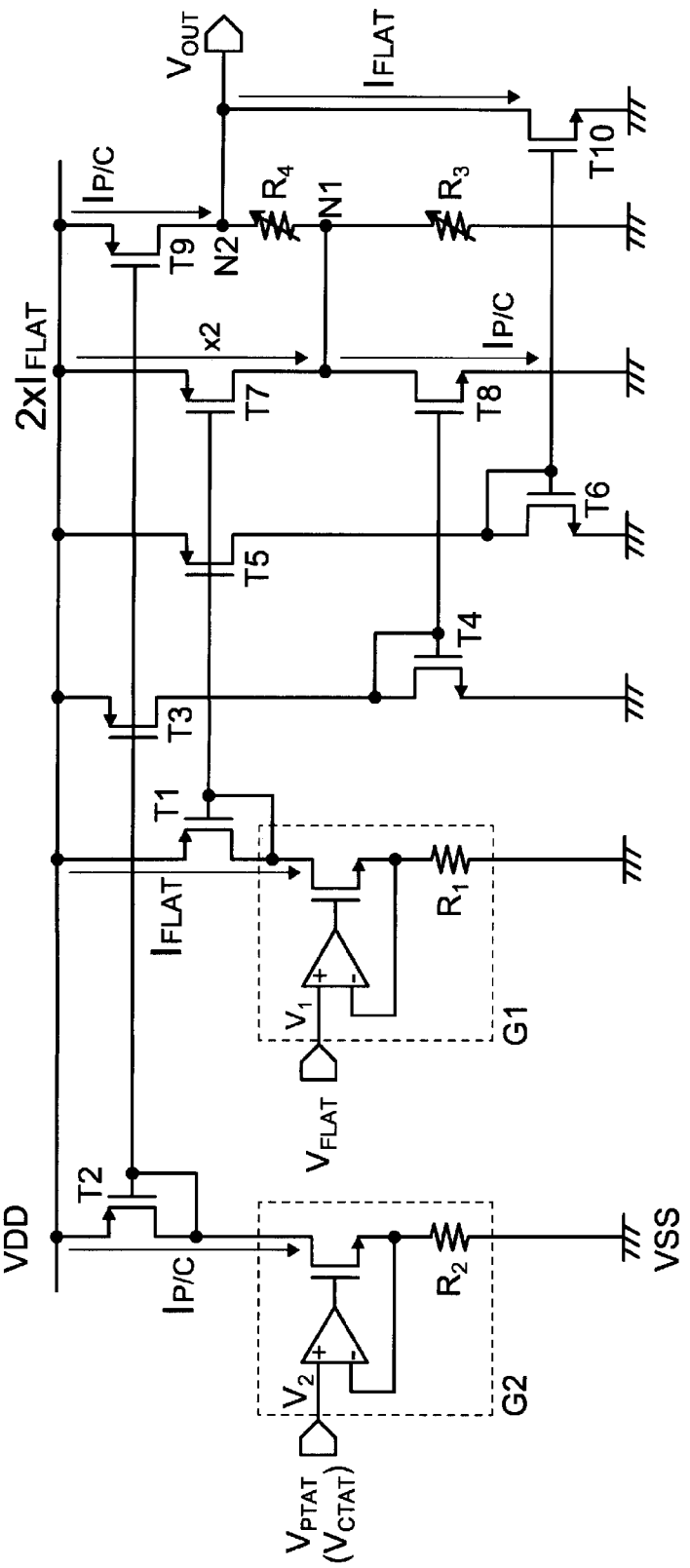
FIG. 2 is a circuit diagram showing a configuration of a voltage generation circuit according to a first embodiment.

FIG. 2 is a circuit diagram showing a configuration of the voltage generation circuit according to the embodiment. In the following description, a voltage having a temperature-dependent characteristic in which the voltage increases with an increase in temperature is referred to as a "voltage $V_{PTAT}$". A voltage having a temperature-dependent characteristic in which the voltage does not change with a change in temperature is referred to as a "voltage $V_{FLAT}$". A voltage having a temperature-dependent characteristic in which the voltage decreases with an increase in temperature is referred to as a "voltage $V_{CTAT}$".

A current that is generated based on the voltage $V_{PTAT}$ and that has a temperature-dependent characteristic in which a current value thereof increases with an increase in temperature is referred to as a "current $I_{PTAT}$". A current that is generated based on the voltage $V_{FLAT}$ and that has a temperature-dependent characteristic in which a current value thereof does not change with a change in temperature is referred to as a "current $I_{FLAT}$". A current that is generated based on the voltage $V_{CTAT}$ and that has a temperature-dependent characteristic in which a current value thereof decreases with an increase in temperature is referred to as a "current $I_{CTAT}$".

In the following description, a current supplied to a circuit (e.g., a current input to an input terminal provided in the circuit) may be the current $I_{PTAT}$ or the current $I_{CTAT}$. Thus, when it is not necessary to particularly distinguish the current $I_{PTAT}$ from the current $I_{CTAT}$, the current may be referred to as a "current $I_{P/C}$".

The voltage generation circuit 28 includes a first current generation circuit G1, a second current generation circuit G2, a plurality of current mirror circuits, a first variable resistor $R_3$, a second variable resistor $R_4$, an output terminal $V_{OUT}$, a first power supply line VDD, and a second power supply line VSS. The first current generation circuit G1, the second current generation circuit G2, and the plurality of current mirror circuits are provided between the first power supply line VDD and the second power supply line VSS.

A high voltage (which may be referred to as a first power supply voltage) is supplied to the first power supply line VDD. A low voltage (which may be referred to as a second power supply voltage) is supplied to the second power supply line VSS. In the following embodiments, the second power supply line VSS is shown as a ground potential, but any fixed voltage may be supplied.

When the voltage $V_{FLAT}$ is input to an input terminal of the first current generation circuit G1, the first current generation circuit G1 generates the current $I_{FLAT}$. A voltage value of the voltage input to the input terminal of the first current generation circuit G1 is $V_1$. A resistance value of a resistance element of the first current generation circuit G1 is $R_1$.

When the voltage $V_{PTAT}$ or the voltage $V_{CTAT}$ is input to an input terminal of the second current generation circuit G2, the second current generation circuit G2 generates the current $I_{PTAT}$ or the current $I_{CTAT}$ (the current $I_{P/C}$). A voltage value of the voltage input to the input terminal of the second current generation circuit G2 is $V_2$. A resistance value of a resistance element of the second current generation circuit G2 is $R_2$.

The configurations of the first current generation circuit G1 and the second current generation circuit G2 are merely examples, and are not limited to the configurations shown in FIG. 2. The first current generation circuit G1 may be any circuit as long as the circuit can provide a current (the current $I_{FLAT}$) having a temperature-dependent characteristic in which a current value thereof does not change with a change in temperature, and may be replaced with another circuit. The second current generation circuit G2 may be any circuit as long as the circuit can provide a current (the current $I_{P/C}$) having a temperature-dependent characteristic in which a current value thereof changes with a change in temperature, and may be replaced with another circuit.

In other words, the voltage generation circuit 28 generates the current $I_{PTAT}$ or the current $I_{CTAT}$ having a temperature-dependent characteristic (which is referred to below as a first temperature-dependent characteristic) in which a current value thereof changes with a predetermined change in temperature, and the current $I_{FLAT}$ having a temperature-dependent characteristic (which is referred to below as a second temperature-dependent characteristic) different from the first temperature-dependent characteristic. The first temperature-dependent characteristic is a temperature-dependent characteristic in which the current value increases (the current $I_{PTAT}$) or decreases (the current $I_{CTAT}$) with an increase in temperature. The second temperature-dependent characteristic is a temperature-dependent characteristic in which the current value does not change (the current $I_{FLAT}$) with a change in temperature. The current $I_{FLAT}$ may have a temperature-dependent characteristic in which the current does not change at all with a change in temperature, and may have a temperature-dependent characteristic in which a change thereof is negligibly small as compared with those of the current $I_{PTAT}$ and the current $I_{CTAT}$.

Each current mirror circuit includes a pair of transistors to which respective gate terminals are connected. The plurality of current mirror circuits shown in FIG. 2 include transistors T1 to T10. Sizes of the transistors are the same. The transistor T7 is denoted by "×2" to indicate that two transistors are connected in parallel. The transistors T1 to T3, T5, T7, and T9 are p-type transistors. The transistors T4, T6, T8, and T10 are n-type transistors.

The first current generation circuit G1 and the transistor T1 are connected in series between the first power supply line VDD and the second power supply line VSS. The second current generation circuit G2 and the transistor T2 are connected in series between the first power supply line VDD and the second power supply line VSS. The transistors T3 and T4 are connected in series between the first power supply line VDD and the second power supply line VSS. The transistors T5 and T6 are connected in series between the first power supply line VDD and the second power supply line VSS. The transistors T7 and T8 are connected in series between the first power supply line VDD and the second power supply line VSS. The transistor T9, the second variable resistor $R_4$, and the first variable resistor $R_3$ are connected in series between the first power supply line VDD and the second power supply line VSS. The transistors T9 and T10 are connected in series between the first power supply line VDD and the second power supply line VSS.

A node between the first variable resistor $R_3$ and the second variable resistor $R_4$ is referred to as a first node N1. A node between the transistor T9 and the second variable resistor $R_4$ is referred to as a second node N2. The first variable resistor $R_3$ and the second variable resistor $R_4$ connected in series with each other and the transistor T10 are connected in parallel between the second node N2 (or the output terminal $V_{OUT}$) and the second power supply line VSS.

A pair of transistors T1 and T5 and a pair of transistors T1 and T7 each form a current mirror circuit. When a current generated by the first current generation circuit G1 and flowing through the transistor T1 is the current $I_{FLAT}$, a current flowing through the transistor T5 is also the current $I_{FLAT}$. When a current flowing through the transistor T1 is the current $I_{FLAT}$, a current flowing through the transistor T7 is a current $(2 \times I_{FLAT})$ that is twice the current $I_{FLAT}$.

In the present embodiment, the current flowing through the transistor T7 is a current that is twice the current $I_{FLAT}$, but the present disclosure is not limited to this configuration. For example, the current flowing through the transistor T7 may be a current $(n \times I_{FLAT})$ that is n times the current $I_{FLAT}$ (n is a positive number excluding 1).

A value of n is not limited to an integer and may include a decimal. In the present embodiment, since the number of transistors T7 is twice the number of transistors T1, the current flowing through the transistor T7 is a current that is twice the current $I_{FLAT}$. By adjusting a ratio of the number of transistors T7 to the number of transistors T1, the value of n can include a decimal. For example, when two transistors are connected in parallel as the transistor T1 and five transistors are connected in parallel as the transistor T7, n is 2.5, and the current flowing through the transistor T7 is a current $(2.5 \times I_{FLAT})$ that is 2.5 times the current $I_{FLAT}$.

A pair of transistors T2 and T3 and a pair of transistors T2 and T9 each form a current mirror circuit. When a current generated by the second current generation circuit G2 and flowing through the transistor T2 is the current $I_{P/C}$, currents respectively flowing through the transistors T3 and T9 are also the current $I_{P/C}$.

When a current flowing through the transistor T3 is the current $I_{P/C}$, a current flowing through the transistor T4 connected in series with the transistor T3 is also the current $I_{P/C}$. A pair of transistors T4 and T8 form a current mirror circuit. When the current flowing through the transistor T4 is the current $I_{P/C}$, a current flowing through the transistor T8 is also the current $I_{P/C}$.

When a current flowing through the transistor T5 is the current $I_{FLAT}$, a current flowing through the transistor T6 connected in series with the transistor T5 is also the current $I_{FLAT}$. A pair of transistors T6 and T10 form a current mirror circuit. When the current flowing through the transistor T6 is the current $I_{FLAT}$, a current flowing through the transistor T10 is also the current $I_{FLAT}$.

Figure 3:
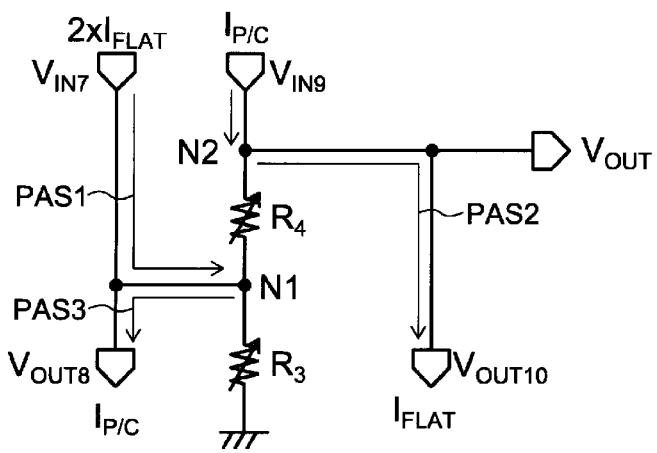
FIG. 3 is a conceptual diagram showing the configuration of the voltage generation circuit according to the first embodiment.

FIG. 3 is a conceptual diagram showing the configuration of the voltage generation circuit according to the embodiment. In FIG. 3, only the first variable resistor $R_3$, the second variable resistor $R_4$, and the output terminal $V_{OUT}$ among circuit elements shown in FIG. 2 are shown, and other circuit elements are shown as input terminals and output terminals in the circuit shown in FIG. 3.

The transistor T7 in FIG. 2 corresponds to an input terminal $V_{IN7}$ in FIG. 3, the transistor T8 in FIG. 2 corresponds to an output terminal $V_{OUT8}$ in FIG. 3, the transistor T9 in FIG. 2 corresponds to an input terminal $V_{IN9}$ in FIG. 3, and the transistor T10 in FIG. 2 corresponds to an output terminal $V_{OUT10}$ in FIG. 3. The current $2\times I_{FLAT}$ is input from the input terminal $V_{IN7}$, the current $I_{P/C}$ is input from the input terminal $V_{IN9}$, the current $I_{P/C}$ is output to the output terminal $V_{OUT8}$, and the current $I_{FLAT}$ is output to the output terminal $V_{OUT10}$.

As shown in FIG. 3, the first node N1 is a node between the first variable resistor $R_3$, the second variable resistor $R_4$, the input terminal $V_{IN7}$, and the output terminal $V_{OUT8}$. The second node N2 is a node between the second variable resistor $R_4$, the input terminal $V_{IN9}$, the output terminal $V_{OUT}$, and the output terminal $V_{OUT10}$. Referring to FIG. 2, since the second node N2 is connected to the first power supply line VDD via the transistor T9, it can be said that the second node N2 is a node between the second variable resistor $R_4$, the output terminal $V_{OUT}$, and the first power supply line VDD.

The voltage generation circuit 28 includes a first path PAS1, a second path PAS2, and a third path PAS3. The first path PAS1 is a path from the input terminal $V_{IN7}$ (or the first power supply line VDD) to the first node N1 without passing through the second variable resistor $R_4$. The second path PAS2 is a path from the second node N2 to the output terminal $V_{OUT10}$ (or the second power supply line VSS) without passing through the second variable resistor $R_4$. The third path PAS3 is a path from the first node N1 to the output terminal $V_{OUT8}$ (or the second power supply line VSS) without passing through the first variable resistor $R_3$. A current flowing through the first path PAS1 is $2\times I_{FLAT}$, a current flowing through the second path PAS2 is the current $I_{FLAT}$, and a current flowing through the third path PAS3 is the current $I_{P/C}$.

1-3. Output of Voltage Generation Circuit

As described above, since the current flowing through the transistor T7 (the current input from the input terminal $V_{IN7}$) is "$2\times I_{FLAT}$", the current flowing through the transistor T8 (the current output to the output terminal $V_{OUT8}$) is "$I_{P/C}$", the current flowing through the transistor T9 (the current input from the input terminal $V_{IN9}$) is "$I_{P/C}$", and the current flowing through the transistor T10 (the current output to the output terminal $V_{OUT10}$) is "$I_{FLAT}$", a voltage of the output terminal $V_{OUT}$ is calculated as in the following Equation (1-1).

$$V_{OUT} = R_3 \cdot (I_{P/C} - I_{FLAT} + 2 \cdot I_{FLAT} - I_{P/C}) + R_4 \cdot (I_{P/C} - I_{FLAT}) \quad (1-1)$$
$$= R_3 \cdot I_{FLAT} + R_4 \cdot (I_{P/C} - I_{FLAT})$$

Referring to FIG. 2, "$I_{P/C}$" and "$I_{FLAT}$" can be expressed by the following Equation (1-2).

$$I_{P/C} = \frac{V_2}{R_2}, \quad (1-2)$$
$$I_{FLAT} = \frac{V_1}{R_1}$$

By substituting Equation (1-2) into Equation (1-1), $V_{OUT}$ can be expressed as the following Equation (1-3).

$$V_{OUT} = \frac{R_3}{R_1} \cdot V_1 + R_4 \cdot \left(\frac{V_2}{R_2} - \frac{V_1}{R_1}\right) \quad (1-3)$$

As shown in Equation (1-1), a current flowing through the first variable resistor $R_3$ is the current $I_{FLAT}$, and a current flowing through the second variable resistor $R_4$ is a current based on a difference between the current $I_{P/C}$ and the current $I_{FLAT}$. As shown in Equation (1-3), when $V_2/R_2=V_1/R_1$ (that is, when $I_{P/C}$=current $I_{FLAT}$) at a certain temperature Temp1, the term of $R_4$ is zero.

1-4. Electrical Characteristics of Voltage Generation Circuit

Figure 4:
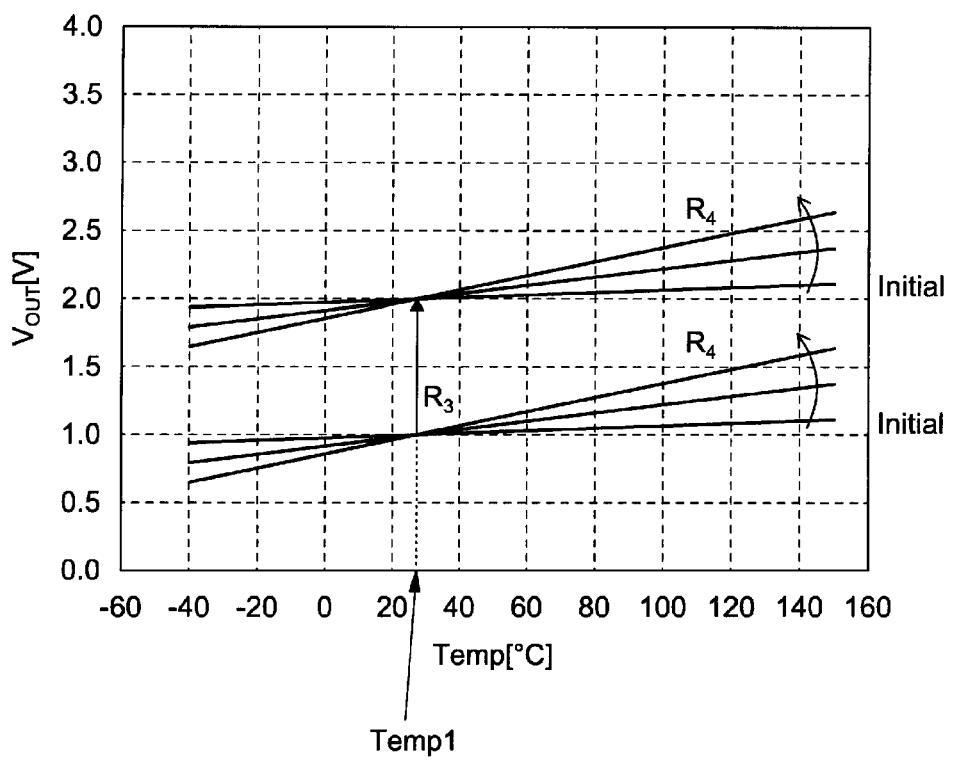
FIG. 4 is a diagram showing electrical characteristics of the voltage generation circuit according to the first embodiment.

FIG. 4 is a diagram showing electrical characteristics of the voltage generation circuit according to the embodiment. As shown in FIG. 4, at the temperature Temp1 (for example, 25° C.), a value of $V_{OUT}$ changes in proportion to a value of the first variable resistor $R_3$, and a gradient of the output voltage $V_{OUT}$ with respect to the temperature changes based on $V_{OUT}=(R_3/R_1)\times V_1$ by a value of the second variable resistor $R_4$. In FIG. 4, by increasing the value of the second variable resistor $R_4$, the gradient of the output voltage $V_{OUT}$ is larger than a slope of "Initial".

As described above, an absolute value of the output voltage $V_{OUT}$ at the temperature Temp1 can be adjusted by the value of the first variable resistor $R_3$, and a temperature gradient of the output voltage $V_{OUT}$ can be adjusted by the value of the second variable resistor $R_4$. Since the values of the first variable resistor $R_3$ and the second variable resistor $R_4$ can be independently controlled, the absolute value of the output voltage $V_{OUT}$ and the temperature gradient of the output voltage $V_{OUT}$ can be independently adjusted.

In the present embodiment, the transistor T7 has a configuration in which two transistors are connected in parallel, but the present disclosure is not limited to this configuration. For example, the number of transistors connected in parallel may be three or more. Alternatively, an L length of the transistor T7 (a distance between a source and a drain) and an L length of the transistor T1 are the same, and a W length (a width in a direction orthogonal to an L length direction) of the transistor T7 may be n times a W length of the transistor T1. In the present embodiment, since n=2, a coefficient of "$R_3 \cdot I_{FLAT}$" in Equation (1-1) is 1, when the value of n is changed, only the coefficient changes, and the above-mentioned effect can be obtained.

In the present embodiment, the current $I_{FLAT}$ generated by the first current generation circuit G1 does not change with a change in temperature, but the first current generation circuit G1 may generate a current varying as the change in temperature, such as the current $I_{P/C}$. However, in this case, a temperature-dependent characteristic of a current generated by the first current generation circuit G1 is different from a temperature-dependent characteristic of the current $I_{P/C}$ generated by the second current generation circuit G2. In such a case as well, since $I_{FLAT}$ is replaced with $I_{P/C}'$ in Equation (1-1), the above-mentioned effect can be obtained.

2. Second Embodiment

A voltage generation circuit according to a second embodiment will be described with reference to FIGS. 5 and 6. A voltage generation circuit 28A according to the second embodiment is similar to the voltage generation circuit 28 according to the first embodiment. In the following description, a description of the same configuration as that of the voltage generation circuit 28 according to the first embodiment will be omitted, and differences from the voltage generation circuit 28 will be mainly described.

2-1. Configuration of Voltage Generation Circuit

Figure 5:
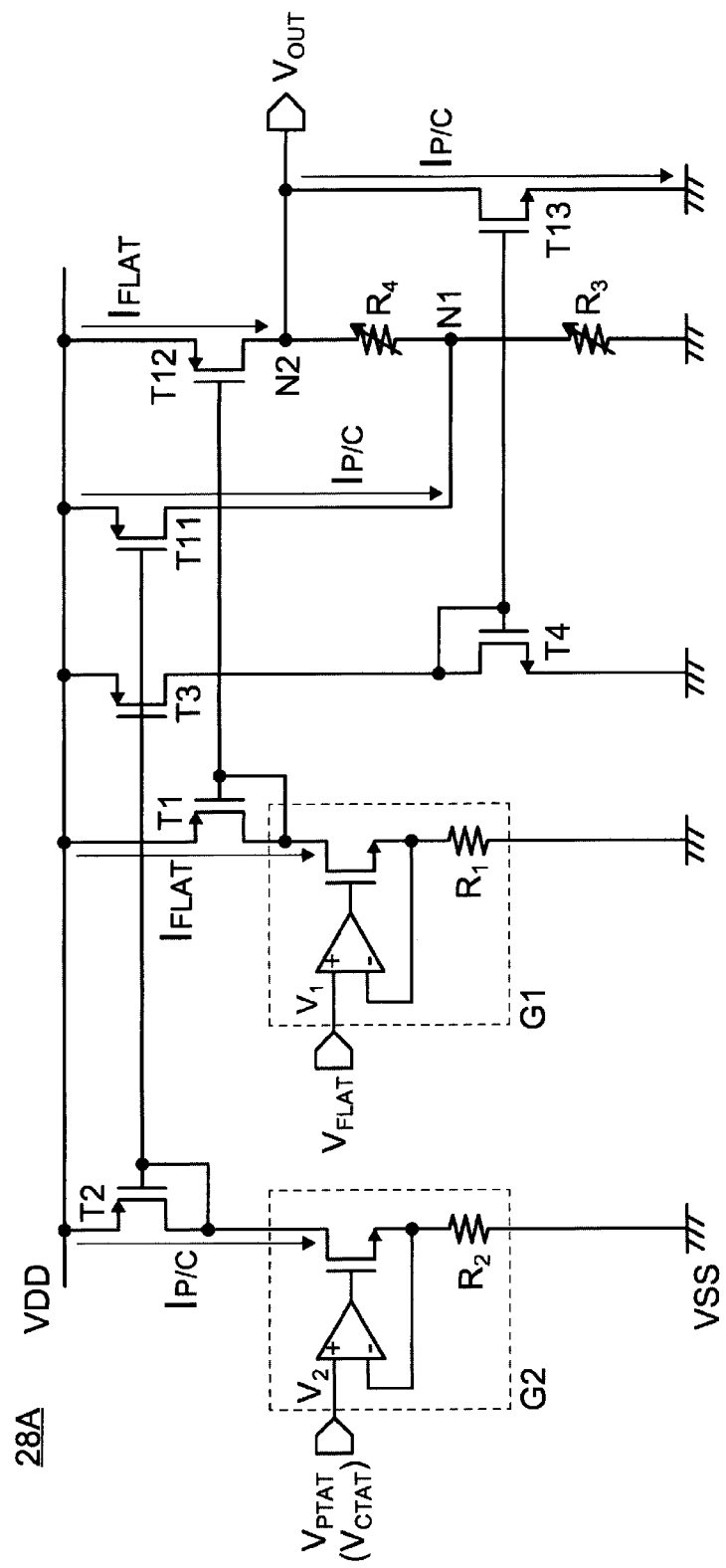
FIG. 5 is a circuit diagram showing a configuration of a voltage generation circuit according to a second embodiment.

FIG. 5 is a circuit diagram showing a configuration of the voltage generation circuit according to the embodiment. As shown in FIG. 5, in the voltage generation circuit 28A, transistors T11 to T13 are provided instead of the transistors T5 to T10 that are provided in the voltage generation circuit 28 shown in FIG. 2. The transistors T11 and T12 are p-type transistors. The transistor T13 is an n-type transistor.

The transistor T11 is provided between the first power supply line VDD and the first node N1. The transistor T12, the second variable resistor $R_4$, and the first variable resistor $R_3$ are connected in series between the first power supply line VDD and the second power supply line VSS. The transistors T12 and T13 are connected in series between the first power supply line VDD and the second power supply line VSS. The first variable resistor $R_3$ and the second variable resistor $R_4$ connected in series with each other and the transistor T13 are connected in parallel between the second node N2 (or the output terminal $V_{OUT}$) and the second power supply line VSS.

A pair of transistors T1 and T12, a pair of transistors T2 and T11, and a pair of transistors 14 and T13 each form a current mirror circuit. In this configuration, a current flowing through the transistor T11 is the current $I_{P/C}$, a current flowing through the transistor T12 is the current $I_{FLAT}$, and a current flowing through the transistor T13 is the current $I_{P/C}$.

Figure 6:
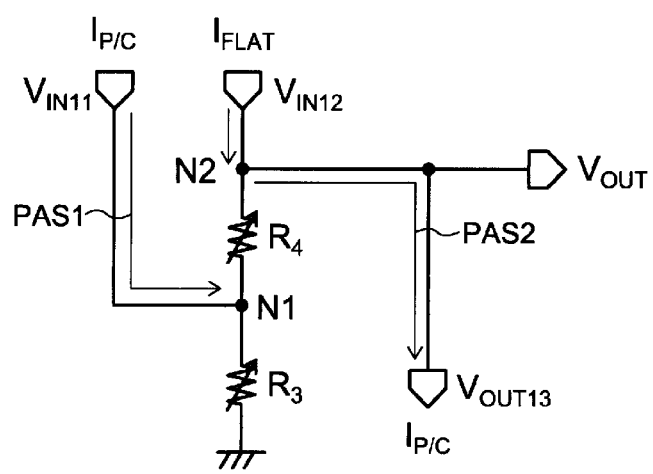
FIG. 6 is a conceptual diagram showing the configuration of the voltage generation circuit according to the second embodiment.

FIG. 6 is a conceptual diagram showing the configuration of the voltage generation circuit according to the embodiment. The transistor T11 in FIG. 5 corresponds to an input terminal $V_{IN11}$ in FIG. 6, the transistor T12 in FIG. 5 corresponds to an input terminal $V_{IN12}$ in FIG. 6, and the transistor T13 in FIG. 5 corresponds to an output terminal $V_{OUT13}$ in FIG. 6. The current $I_{P/C}$ is input from the input terminal $V_{IN11}$, the current $I_{FLAT}$ is input from the input terminal $V_{IN12}$, and the current $I_{P/C}$ is output to the output terminal $V_{OUT13}$.

As shown in FIG. 6, the first node N1 is a node between the first variable resistor $R_3$, the second variable resistor $R_4$, and the input terminal $V_{IN11}$. The second node N2 is a node between the second variable resistor $R_4$, the input terminal $V_{IN12}$, the output terminal $V_{OUT}$, and the output terminal $V_{OUT13}$. Referring to FIG. 5, since the second node N2 is connected to the first power supply line VDD via the transistor T12, it can be said that the second node N2 is a node between the second variable resistor $R_4$, the output terminal $V_{OUT}$, and the first power supply line VDD.

The voltage generation circuit 28A includes the first path PAS1 and the second path PAS2. The first path PAS1 is a path from the input terminal $V_{IN11}$ (or the first power supply line VDD) to the first node N1 without passing through the second variable resistor $R_4$. The second path PAS2 is a path from the second node N2 to the output terminal $V_{OUT13}$ (or the second power supply line VSS) without passing through the second variable resistor $R_4$. A current flowing through each of the first path PAS1 and the second path PAS2 is the current $I_{P/C}$.

2-2. Output of Voltage Generation Circuit

As described above, since a current flowing through the transistor T11 (a current input from the input terminal $V_{IN11}$) is "$I_{P/C}$", a current flowing through the transistor T12 (a current input from the input terminal $V_{IN12}$) is "$I_{FLAT}$", and a current flowing through the transistor T13 (a current output to the output terminal $V_{OUT13}$) is "$I_{P/C}$", a voltage of the output terminal $V_{OUT}$ is calculated as in the following Equation (2-1).

$$V_{OUT} = R_3 \cdot (I_{FLAT} - I_{P/C} + I_{P/C}) + R_4 \cdot (I_{FLAT} - I_{P/C}) \quad (2-1)$$
$$= R_3 \cdot I_{FLAT} + R_4 \cdot (I_{FLAT} - I_{P/C})$$

As described above, "$I_{P/C}$" and "$I_{FLAT}$" can be expressed as in the Equation (1-2) described above.

By substituting Equation (1-2) into Equation (2-1), $V_{OUT}$ can be expressed as in the following Equation (2-2).

$$V_{OUT} = \frac{R_3}{R_1} \cdot V_1 + R_4 \cdot \left(\frac{V_1}{R_1} - \frac{V_2}{R_2}\right) \quad (2-2)$$

As shown in Equation (2-1), a current flowing through the first variable resistor $R_3$ is the current $I_{FLAT}$, and a current flowing through the second variable resistor $R_4$ is a current based on a difference between the current $I_{P/C}$ and the current $I_{FLAT}$. As shown in Equation (2-2), when $V_2/R_2 = V_1/R_1$ is satisfied at a certain temperature Temp1 (that is, when $I_{P/C}$=current $I_{FLAT}$), the term of $R_4$ is zero.

Therefore, as in the voltage generation circuit 28 according to the first embodiment, the voltage generation circuit 28A according to the present embodiment can adjust an absolute value of the output voltage $V_{OUT}$ at a certain temperature by a value of the first variable resistor $R_3$, and can adjust a temperature gradient of the output voltage $V_{OUT}$ by a value of the second variable resistor $R_4$. Since the values of the first variable resistor $R_3$ and the second variable resistor $R_4$ can be independently controlled, the absolute value of the output voltage $V_{OUT}$ and the temperature gradient of the output voltage $V_{OUT}$ can be independently adjusted.

3. Third Embodiment

A voltage generation circuit according to a third embodiment will be described with reference to FIGS. 7 and 8. A voltage generation circuit 28B according to the third embodiment is similar to the voltage generation circuit 28 according to the first embodiment. In the following description, a description of the same configuration as that of the voltage generation circuit 28 according to the first embodiment will be omitted, and differences from the voltage generation circuit 28 will be mainly described.

3-1. Configuration of Voltage Generation Circuit

Figure 7:
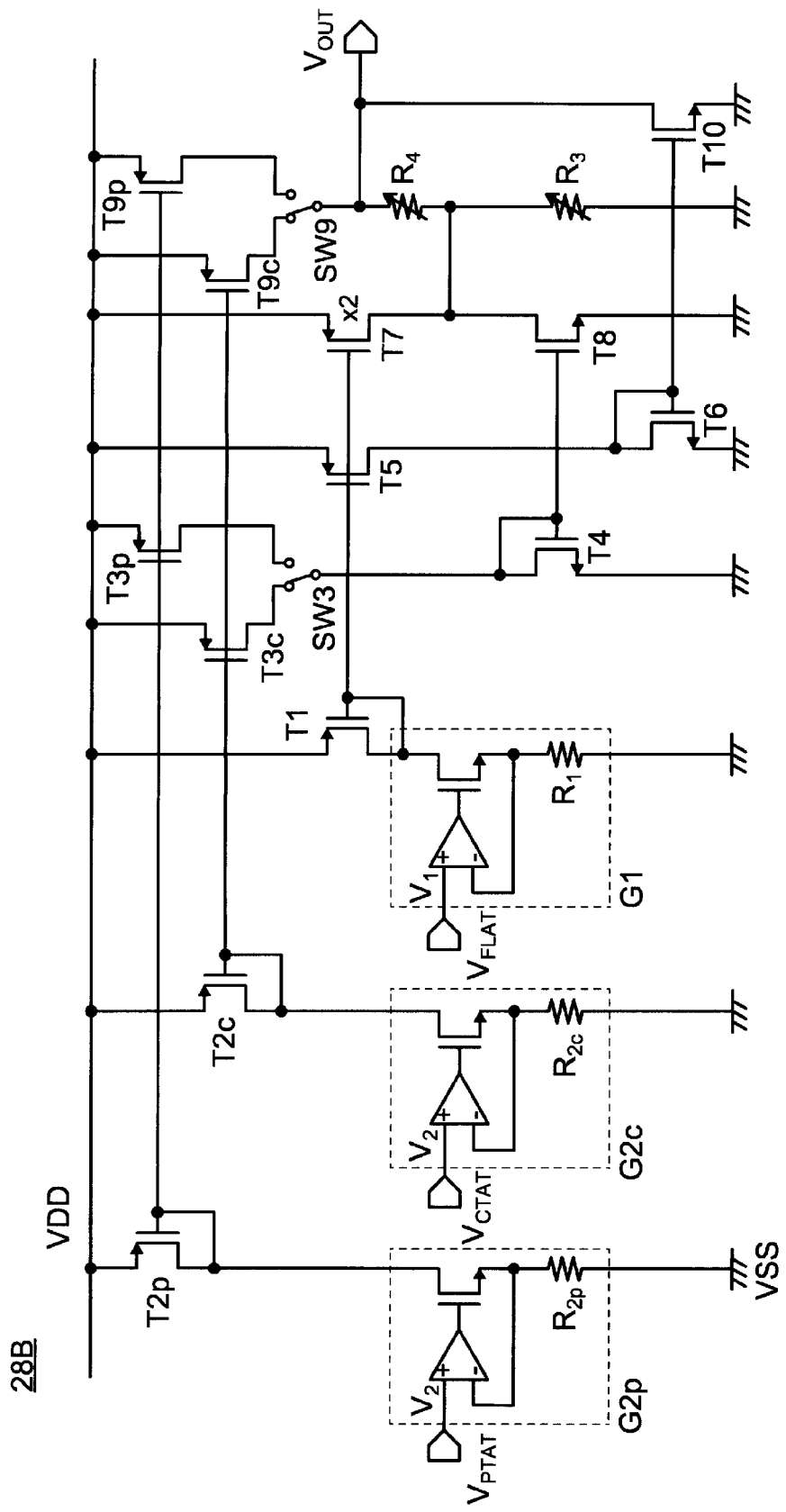
FIG. 7 is a circuit diagram showing a configuration of a voltage generation circuit according to a third embodiment.

FIG. 7 is a circuit diagram showing a configuration of the voltage generation circuit according to the embodiment. As shown in FIG. 7, in the voltage generation circuit 28B, a second current generation circuit G2 provided in the voltage generation circuit 28 shown in FIG. 2 is divided into a positive characteristic second current generation circuit G2p and a negative characteristic second current generation circuit G2c. Similarly, the transistor T2 in FIG. 2 is divided into transistors T2p and T2c. Also, in this configuration, the transistor T3 in FIG. 2 is divided into transistors T3p and T3c. Similarly, the transistor T9 in FIG. 2 is divided into transistors T9p and T9c.

When the voltage $V_{PTAT}$ is input to an input terminal of the positive characteristic second current generation circuit G2p, the positive characteristic second current generation circuit G2p generates the current $I_{PTAT}$. A resistance value of a resistance element of the positive characteristic second current generation circuit G2p is $R_{2p}$. When the voltage $V_{CTAT}$ is input to an input terminal of the negative characteristic second current generation circuit G2c, the negative characteristic second current generation circuit G2c generates the current $I_{CTAT}$. A resistance value of a resistance element of the negative characteristic second current generation circuit G2c is $R_{2c}$.

The transistors T2p, T2c, T3p, T3c, T9p, and T9c are all p-type transistors.

A pair of transistors T2p and T3p and a pair of transistors T2p and T9p each form a current mirror circuit. When a current generated by the positive characteristic second current generation circuit G2p and flowing through the transistor T2p is the current $I_{PTAT}$, currents flowing through the transistors T3p and T9p are also the current $I_{PTAT}$.

A pair of transistors T2c and T3c and a pair of transistors T2c and T9c each form a current mirror circuit. When a current generated by the negative characteristic second current generation circuit G2c and flowing through the transistor T2c is the current $I_{CTAT}$, currents flowing through the transistors T3c and T9c are also the current $I_{CTAT}$.

The transistors T3p and T3c are connected to the transistor T4 via a switch SW3. The transistor T4 becomes connected to either the transistor T3p or the transistor T3c by controlling the switch SW3. That is, a state in which the transistor T3p and the transistor T4 are connected in series and a state in which the transistor T3c and the transistor T4 are connected in series are switched by the switch SW3.

When the transistor T3p is selected by the switch SW3, since a current flowing through the transistor T3p is the current $I_{PTAT}$, a current flowing through the transistor T4 connected in series with the transistor T3p is also the current $I_{PTAT}$. Since the pair of transistors T4 and T8 form a current mirror circuit, a current flowing through the transistor T8 is also the current $I_{PTAT}$.

When the transistor T3c is selected by the switch SW3, since a current flowing through the transistor T3c is the current $I_{CTAT}$, a current flowing through the transistor T4 connected in series with the transistor T3c is also the current $I_{CTAT}$. Since the pair of transistors T4 and T8 form a current mirror circuit, the current flowing through the transistor T8 is also the current $I_{CTAT}$.

As described above, the current flowing through the transistor T8 is controlled to be the current $I_{PTAT}$ or the current $I_{CTAT}$ by the switch SW3.

The transistors T9p and T9c are connected to the second variable resistor R4 via a switch SW9. The second variable resistor $R_4$ becomes connected to either the transistor T9p or the transistor T9c by controlling the switch SW9. That is, a state in which the transistor T9p, the second variable resistor $R_4$, and the first variable resistor $R_3$ are connected in series and a state in which the transistor T9c, the second variable resistor $R_4$, and the first variable resistor $R_3$ are connected in series are switched by the switch SW9.

The switch SW3 and the switch SW9 are interlocked with each other. The switches are controlled such that when the switch SW3 selects the transistor T3p, the switch SW9 selects the transistor T9p. The switches are controlled such that when the switch SW3 selects the transistor T3c, the switch SW9 selects the transistor T9c.

Figure 8:
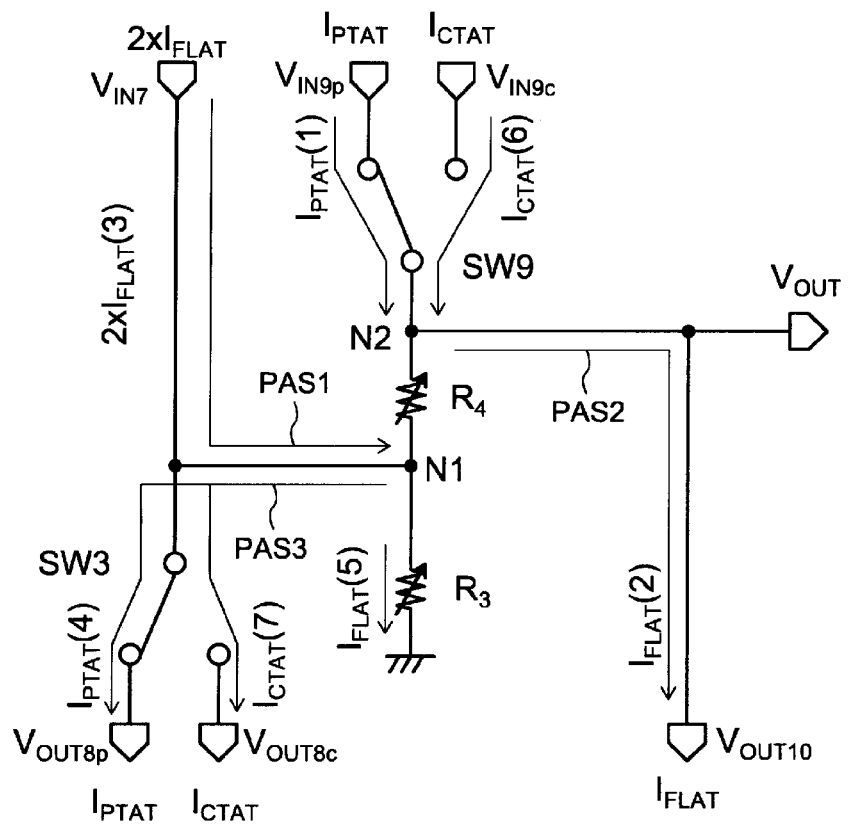
FIG. 8 is a conceptual diagram showing the configuration of the voltage generation circuit according to the third embodiment.

FIG. 8 is a conceptual diagram showing the configuration of the voltage generation circuit according to the embodiment. In FIG. 8, only the first variable resistor $R_3$, the second variable resistor $R_4$, and the output terminal $V_{OUT}$ among circuit elements shown in FIG. 7 are shown, and other circuit elements are shown as input terminals and output terminals in the circuit shown in FIG. 8. The transistor T7 in FIG. 7 corresponds to the input terminal $V_{IN7}$ in FIG. 8, the transistor T8 in FIG. 7 corresponds to output terminals $V_{OUT8p}$ and $V_{OUT8c}$ in FIG. 8, the transistors T9p and T9c in FIG. 7 correspond to input terminals $V_{IN9p}$ and $V_{IN9c}$ in FIG. 8, and the transistor T10 in FIG. 7 corresponds to the output terminal $V_{OUT10}$ in FIG. 8.

The input terminals $V_{IN9p}$ and $V_{IN9c}$ are switched by the switch SW9. Since the switch SW3 is connected to the transistors T3p and T3c in FIG. 7, and the current flowing through the transistor T8 is controlled by the switching of the switch SW3 as described above, the output terminals $V_{OUT8p}$ and the $V_{OUT8c}$ are shown to be switched by the switch SW3 in FIG. 8.

In the following description, a case in which the switch SW3 is connected to the output terminal $V_{OUT8p}$ and the switch SW9 is connected to the input terminal $V_{IN9p}$ is referred to as "during a PTAT operation". Meanwhile, a case in which the switch SW3 is connected to the output terminal $V_{OUT8c}$ and the switch SW9 is connected to the input terminal $V_{IN9c}$ is referred to as "during a CTAT operation".

As shown in FIG. 8, the voltage generation circuit 28B includes the first path PAS1, the second path PAS2, and the third path PAS3. The first path PAS1 is a path from the input terminal $V_{IN7}$ (or the first power supply line VDD) to the first node N1 without passing through the second variable resistor $R_4$. The second path PAS2 is a path from the second node N2 to the output terminal $V_{OUT10}$ (or the second power supply line VSS) without passing through the second variable resistor $R_4$. The third path PAS3 is a path from the first node N1 to the output terminal $V_{OUT8p}$ or $V_{OUT8c}$ (or the second power supply line VSS) without passing through the first variable resistor $R_3$.

When the switch SW3 is connected to the output terminal $V_{OUT8p}$ and the switch SW9 is connected to the input terminal $V_{IN9p}$, a current $2 \times I_{FLAT}$ (3) is input from the input terminal $V_{IN7}$, a current $I_{PTAT}$ (1) is input from the input terminal $V_{IN9p}$, a current $I_{PTAT}$ (4) is output to the output terminal $V_{OUT8p}$, and a current $I_{FLAT}$ (2) is output to the output terminal $V_{OUT10}$. Although the details will be described later, a current flowing through the first variable resistor $R_3$ is determined to be a current $I_{FLAT}$ (5) due to the above input and output.

The numbers described in parentheses attached after the reference numerals indicating the above currents are given to distinguish currents flowing through different paths. Therefore, the same reference numerals before parentheses indicate the same current value. That is, for example, $I_{PTAT}$ (1) and $I_{PTAT}$ (4) are currents that flow in different paths, but current values are the same.

When the switch SW3 is connected to the output terminal $V_{OUT8c}$ and the switch SW9 is connected to the input terminal $V_{IN9c}$, the current $2 \times I_{FLAT}$ (3) is input from the input terminal $V_{IN7}$, a current $I_{CTAT}$ (6) is input from the input terminal $V_{IN9c}$, a current $I_{CTAT}$ (7) is output to the output terminal $V_{OUT8c}$, and the current $I_{FLAT}$ (2) is output to the output terminal $V_{OUT10}$. Although the details will be described later, the current flowing through the first variable resistor $R_3$ is determined to be the current $I_{FLAT}$ (5) due to the above input and output.

"During the PTAT operation", a current ($I_{R3}$) flowing through the first variable resistor $R_3$ and a current ($I_{R4}$) flowing through the second variable resistor $R_4$ are expressed by the following Equations (3-1) and (3-2), respectively.

$$I_{R4} = I_{PTAT}(1) - I_{FLAT}(2) \tag{3-1}$$

$$I_{R3} = 2 \times I_{FLAT}(3) + (I_{PTAT}(1) - I_{FLAT}(2)) - I_{PTAT}(4) \tag{3-2}$$

"During the CTAT operation", the current ($I_{R3}$) flowing through the first variable resistor $R_3$ and the current ($I_{R4}$) flowing through the second variable resistor $R_4$ are expressed as in the following Equations (3-3) and (3-4), respectively.

$$I_{R4}=I_{CTAT}(6)-I_{FLAT}(2) \quad (3\text{-}3)$$

$$I_{R3}=2\times I_{FLAT}(3)+(I_{CTAT}(6)-I_{FLAT}(2))-I_{CTAT}(7) \quad (3\text{-}4)$$

In the case of Equation (3-2), the term of $I_{PTAT}$ disappears and only $I_{FLAT}$ remains. In the case of Equation (3-4), the term of $I_{CTAT}$ disappears and only $I_{FLAT}$ remains. As described above, the remaining $I_{FLAT}$ is referred to as $I_{FLAT}$ (5). That is, the current ($I_{R3}$) flowing through the first variable resistor $R_3$ is $I_{FLAT}$ (5) both "during the PTAT operation" and "during the CTAT operation".

In other words, "during the PTAT operation", when a current flowing through the second node N2 is the current $I_{PTAT}$ (1), a current flowing through the first path PAS1 is the current $2\times I_{FLAT}$ (3), a current flowing through the second path PAS2 is the current $I_{FLAT}$ (2), and a current flowing through the third path PAS3 is the current $I_{PTAT}$ (4).

"During the CTAT operation", when the current flowing through the second node N2 is the current $I_{CTAT}$ (6), the current flowing through the first path PAS1 is the current $2\times I_{FLAT}$ (3), the current flowing through the second path PAS2 is the current $I_{FLAT}$ (2), and the current flowing through the third path PAS3 is the current $I_{CTAT}$ (7). The current flowing through the first path PAS1 may be a current ($n\times I_{FLAT}$) that is n times the current $I_{FLAT}$ (n is a positive number excluding 1).

3-2. Output of Voltage Generation Circuit 28B

A voltage of the output terminal $V_{OUT}$ differs during the PTAT operation and during the CTAT operation. In each case, the voltage of the output terminal $V_{OUT}$ is calculated as follows.

3-2-1. Output of Voltage Generation Circuit During PTAT Operation

Based on Equations (3-1) and (3-2), the voltage of the output terminal $V_{OUT}$ is calculated as in the following Equation (3-5).

$$V_{OUT}=R_3 \cdot I_{FLAT}(5)+R_4 \cdot (I_{PTAT}(1)-I_{FLAT}(2)) \quad (3\text{-}5)$$

3-2-2. Output of Voltage Generation Circuit During CTAT Operation

Based on Equations (3-3) and (3-4), the voltage of the output terminal $V_{OUT}$ is calculated as in the following Equation (3-6).

$$V_{OUT}=R_3 \cdot I_{FLAT}(5)+R_4 \cdot (I_{CTAT}(6)-I_{FLAT}(2)) \quad (3\text{-}6)$$

As shown in Equations (3-5) and (3-6), the current flowing through the first variable resistor $R_3$ is the current $I_{FLAT}$ (5), and a current flowing through the second variable resistor $R_4$ is a current based on a difference between the current $I_{PTAT}$ (1) and the current $I_{FLAT}$ (2) or a current based on a difference between the current $I_{CTAT}$ (6) and the current $I_{FLAT}$ (2). As shown in Equation (3-5), when $I_{PTAT}=I_{FLAT}$ at a certain temperature Temp1, the term of $R_4$ is zero. As shown in Equation (3-6), when $I_{CTAT}=I_{FLAT}$ at a certain temperature Temp1, the term of $R_4$ is zero.

Therefore, as in the voltage generation circuit 28 according to the first embodiment, the voltage generation circuit 28B according to the present embodiment can adjust an absolute value of the output voltage $V_{OUT}$ at a certain temperature by a value of the first variable resistor $R_3$, and can adjust a temperature gradient of the output voltage $V_{OUT}$ by a value of the second variable resistor $R_4$. Since the values of the first variable resistor $R_3$ and the second variable resistor $R_4$ can be independently controlled, the absolute value of the output voltage $V_{OUT}$ and the temperature gradient of the output voltage $V_{OUT}$ can be independently adjusted. Further, by switching the switches SW3 and SW9, it is possible to supply both the output voltage $V_{OUT}$ in which the voltage value increases with an increase in temperature and the output voltage $V_{OUT}$ in which the voltage value decreases with the increase in temperature.

4. Fourth Embodiment

A voltage generation circuit according to a fourth embodiment will be described with reference to FIGS. 9 and 10. A voltage generation circuit 28C according to the fourth embodiment is similar to the voltage generation circuit 28B according to the third embodiment. In the following description, a description of the same configuration as that of the voltage generation circuit 28B according to the third embodiment will be omitted, and differences from the voltage generation circuit 28B will be mainly described.

4-1. Configuration of Voltage Generation Circuit

Figure 9:
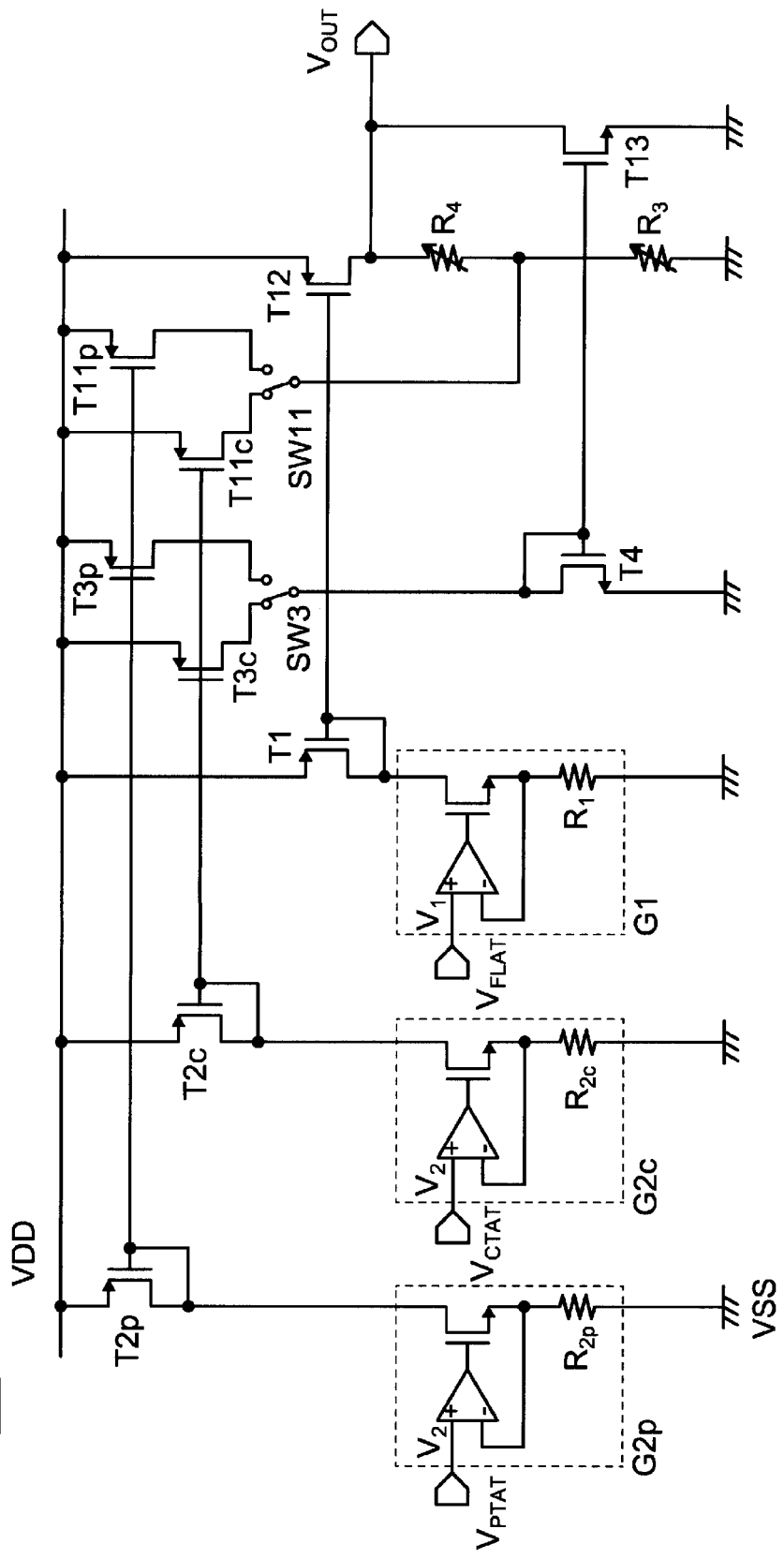
FIG. 9 is a circuit diagram showing a configuration of a voltage generation circuit according to a fourth embodiment.

FIG. 9 is a circuit diagram showing a configuration of the voltage generation circuit according to the embodiment. As shown in FIG. 9, in the voltage generation circuit 28C, the transistors T11 to T13 are provided instead of the transistors T5 to T10 that are provided in the voltage generation circuit 28B shown in FIG. 7. Since the transistors T12 and T13 in FIG. 9 are the same as the transistors T12 and T13 in FIG. 5, detailed descriptions will be omitted.

Transistors T11p and T11c are connected to the first node N1 via a switch SW11. A state in which the transistor T11p is connected to the first node N1 and a state in which the transistor T11c is connected to the first node N1 are switched by the switch SW11.

The transistors T11p, T11c, and T12 are p-type transistors. The transistor T13 is an n-type transistor.

A pair of transistors T2p and T11p form a current mirror circuit. Therefore, when a current generated by the positive characteristic second current generation circuit G2p and flowing through the transistor T2p is the current $I_{PTAT}$, a current flowing through the transistor T11p when the transistor T11p is selected by the switch SW11 is also the current $I_{PTAT}$.

A pair of transistors T2c and T11c form a current mirror circuit. Therefore, when a current generated by the negative characteristic second current generation circuit G2c and flowing through the transistor T2c is the current $I_{CTAT}$, a current flowing through the transistor T11c when the transistor T11c is selected by the switch SW11 is also the current $I_{CTAT}$.

When the transistor T3p is selected by the switch SW3, since a current flowing through the transistor T3p is the current $I_{PTAT}$, a current flowing through the transistor T4 connected in series with the transistor T3p is also the current $I_{PTAT}$. Since a pair of transistors T4 and T13 form a current mirror circuit, a current flowing through the transistor T13 is also the current $I_{PTAT}$.

When the transistor T3c is selected by the switch SW3, since a current flowing through the transistor T3c is the current $I_{CTAT}$, a current flowing through the transistor T4 connected in series with the transistor T3c is also the current $I_{CTAT}$. Since the pair of transistors T4 and T13 form a current mirror circuit, the current flowing through the transistor T13 is also the current $I_{CTAT}$.

As described above, the current flowing through the transistor T13 is controlled to be the current $I_{PTAT}$ or the current $I_{CTAT}$ by the switch SW3.

The switch SW3 and the switch SW11 are interlocked with each other. The switches are controlled such that when the switch SW3 selects the transistor T3$p$, the switch SW11 selects the transistor T11$p$. The switches are controlled such that when the switch SW3 selects the transistor T3$c$, the switch SW11 selects the transistor T11$c$.

Figure 10:
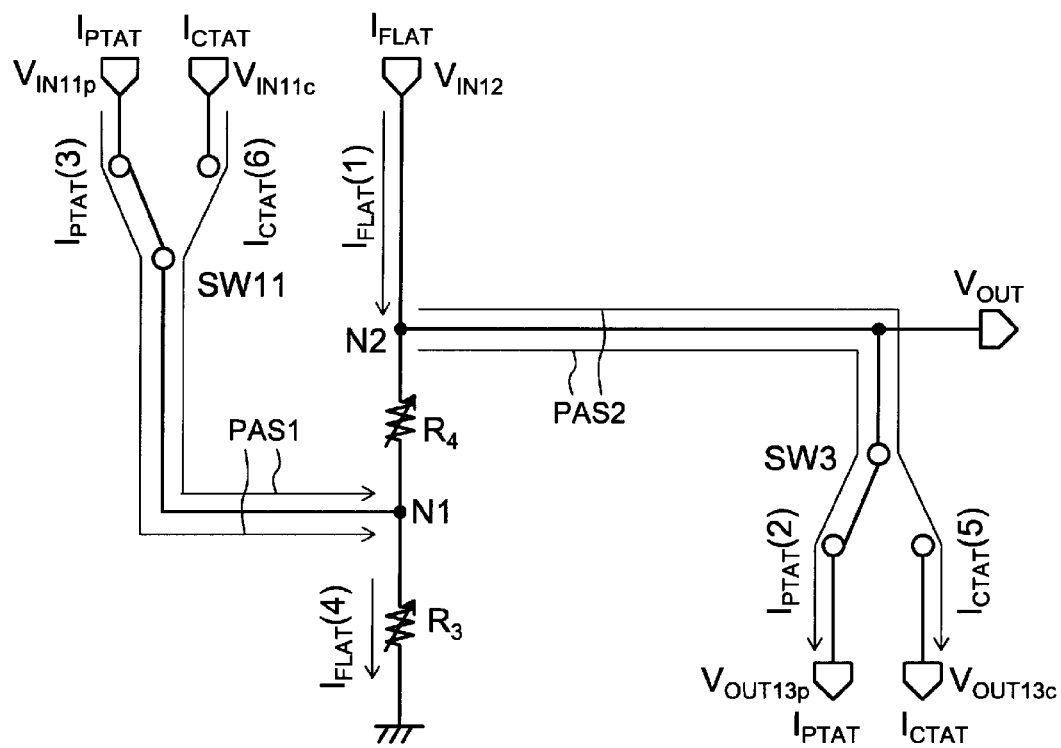
FIG. 10 is a conceptual diagram showing the configuration of the voltage generation circuit according to the fourth embodiment.

FIG. 10 is a conceptual diagram showing the configuration of the voltage generation circuit according to the embodiment. In FIG. 10, only the first variable resistor $R_3$, the second variable resistor $R_4$, and the output terminal $V_{OUT}$ among circuit elements shown in FIG. 9 are shown, and other circuit elements are shown as input terminals and output terminals in the circuit shown in FIG. 10. The transistors T11$p$ and T11$c$ in FIG. 9 correspond to input terminals $V_{IN11p}$ and $V_{IN11c}$ in FIG. 10, the transistor T12 in FIG. 9 corresponds to the input terminal $V_{IN12}$ in FIG. 10, and the transistor T13 in FIG. 9 corresponds to output terminals $V_{OUT13p}$ and $V_{OUT13c}$ in FIG. 10.

The input terminals $V_{IN11p}$ and $V_{IN11c}$ are switched by the switch SW11. Since the switch SW3 is connected to the transistors T3$p$ and T3$c$ in FIG. 9, and the current flowing through the transistor T13 is controlled by the switching of the switch SW3 as described above, the output terminals $V_{OUT13p}$ and $V_{OUT13c}$ are shown to be switched by the switch SW3 in FIG. 10.

As shown in FIG. 10, the voltage generation circuit 28C includes the first path PAS1 and the second path PAS2. The first path PAS1 is a path from the input terminal $V_{IN11p}$ or $V_{IN11c}$ (or the first power supply line VDD) to the first node N1 without passing through the second variable resistor $R_4$. The second path PAS2 is a path from the second node N2 to the output terminal $V_{OUT13p}$ or $V_{OUT13c}$ (or the second power supply line VSS) without passing through the second variable resistor $R_4$.

When the switch SW3 is connected to the output terminal $V_{OUT13p}$ and the switch SW11 is connected to the input terminal $V_{IN11p}$, a current $I_{PTAT}$ (3) is input from the input terminal $V_{IN11p}$, a current $I_{FLAT}$ (1) is input from the input terminal $V_{IN12}$, a current $I_{PTAT}$ (2) is output to the output terminal $V_{OUT13p}$. Although the details will be described later, a current flowing through the first variable resistor $R_3$ is determined to be a current $I_{FLAT}$ (4) due to the above input and output.

Meanwhile, when the switch SW3 is connected to the output terminal $V_{OUT13c}$ and the switch SW11 is connected to an input terminal $V_{IN11c}$, a first current $I_{CTAT}$ (6) is input from the input terminal $V_{IN11c}$, the current $I_{FLAT}$ (1) is input from the input terminal $V_{IN12}$, and a current $I_{CTAT}$ (5) is output to the output terminal $V_{OUT13c}$. Although the details will be described later, a current flowing through the first variable resistor $R_3$ is determined to be a current $I_{FLAT}$ (4) due to the above input and output.

When the switch SW3 is connected to the output terminal $V_{OUT13p}$ and the switch SW11 is connected to the input terminal $V_{IN11p}$, a current ($I_{R3}$) flowing through the first variable resistor $R_3$ and a current ($I_{R4}$) flowing through the second variable resistor $R_4$ are expressed by the following Equations (4-1) and (4-2), respectively.

$$I_{R4}=I_{FLAT}(1)-I_{PTAT}(2) \tag{4-1}$$

$$I_{R3}=I_{PTAT}(3)+(I_{FLAT}(1)-I_{PTAT}(2)) \tag{4-2}$$

In this case, since a current of a value based on $I_{FLAT}$ (1)–$I_{PTAT}$ (2) is output to the output terminal $V_{OUT}$, the case of performing such an operation is referred to "during a CTAT operation".

When the switch SW3 is connected to the output terminal $V_{OUT13c}$ and the switch SW11 is connected to the input terminal $V_{IN11c}$, the current ($I_{R3}$) flowing through the first variable resistor $R_3$ and the current ($I_{R4}$) flowing through the second variable resistor $R_4$ are expressed as in the following Equations (4-3) and (4-4), respectively.

$$I_{R4}=I_{FLAT}(1)-I_{CTAT}(5) \tag{4-3}$$

$$I_{R3}=I_{CTAT}(6)+(I_{FLAT}(1)-I_{CTAT}(5)) \tag{4-4}$$

In this case, since a current of a value based on $I_{FLAT}$ (1)–$I_{CTAT}$ (5) is output to the output terminal $V_{OUT}$, the case of performing such an operation is referred to as "during a PTAT operation".

In the case of Equation (4-2), the term of $I_{PTAT}$ disappears and $I_{FLAT}$ remains. In the case of Equation (4-4), the term of $I_{CTAT}$ disappears and only $I_{FLAT}$ remains. As described above, the remaining $I_{FLAT}$ is referred to as $I_{FLAT}$ (4). That is, the current ($I_{R3}$) flowing through the first variable resistor $R_3$ is $I_{FLAT}$ (4) both "during the CTAT operation" and "during the PTAT operation".

In other words, "during the CTAT operation", when a current flowing through the first path PAS1 to the first node N1 is the current $I_{PTAT}$ (3), a current supplied to the second node N2 is the current $I_{FLAT}$ (1), and a current flowing through the second path PAS2 is the current $I_{PTAT}$ (2). "During the PTAT operation", when the current flowing through the first path PAS1 to the first node N1 is the current $I_{CTAT}$ (6), the current supplied to the second node N2 is the current $I_{FLAT}$ (1), and the current flowing through the second path PAS2 is the current $I_{CTAT}$ (5).

4-2. Output of Voltage Generation Circuit

A voltage of the output terminal $V_{OUT}$ differs during the CTAT operation and during the PTAT operation. In each case, the voltage of the output terminal $V_{OUT}$ is calculated as follows.

4-2-1. Output of Voltage Generation Circuit During CTAT Operation

Based on Equations (4-1) and (4-2), the voltage of the output terminal $V_{OUT}$ is calculated as in the following Equation (4-5).

$$V_{OUT}=R_3 \cdot I_{FLAT}(4)+R_4 \cdot (I_{FLAT}(1)-I_{PTAT}(2)) \tag{4-5}$$

4-2-2. Output of Voltage Generation Circuit During PTAT Operation

Based on Equations (4-3) and (4-4), the voltage of the output terminal $V_{OUT}$ is calculated as in the following Equation (4-6).

$$V_{OUT}=R_3 \cdot I_{FLAT}(4)+R_4 \cdot (I_{FLAT}(1)-I_{CTAT}(5)) \tag{4-6}$$

As shown in Equations (4-5) and (4-6), a current flowing through the first variable resistor $R_3$ is the current $I_{FLAT}$ (4), and a current flowing through the second variable resistor $R_4$ is a current based on a difference between the current $I_{PTAT}$ (2) and the current $I_{FLAT}$ (1) or a current based on a difference between the current $I_{CTAT}$ (5) and the current $I_{FLAT}$ (1). As shown in Equation (4-5), when $I_{PTAT}=I_{FLAT}$ at a certain temperature Temp1, the term of $R_4$ is zero. As shown in Equation (4-6), when $I_{CTAT}=I_{FLAT}$ at a certain temperature Temp1, the term of $R_4$ is zero.

Therefore, the voltage generation circuit 28C according to the present embodiment can obtain the same effect as the voltage generation circuit 28B according to the third embodiment. Specifically, an absolute value of the output voltage $V_{OUT}$ at a temperature can be adjusted by a value of the first variable resistor $R_3$, and a temperature gradient of the output voltage $V_{OUT}$ can be adjusted by a value of the second variable resistor $R_4$. Since the values of the first variable resistor $R_3$ and the second variable resistor $R_4$ can be independently controlled, the absolute value of the output voltage $V_{OUT}$ and the temperature gradient of the output voltage $V_{OUT}$ can be independently adjusted. Further, by switching the switches SW3 and SW11, it is possible to supply both the output voltage $V_{OUT}$ in which the voltage value increases with an increase in temperature and the output voltage $V_{OUT}$ in which the voltage value decreases with the increase in temperature.

5. Fifth Embodiment

A voltage generation circuit according to a fifth embodiment will be described with reference to FIGS. 11 and 12. A voltage generation circuit 28D according to the fifth embodiment is similar to the voltage generation circuit 28 according to the first embodiment. In the following description, a description of the same configuration as that of the voltage generation circuit 28 according to the first embodiment will be omitted, and differences from the voltage generation circuit 28 will be mainly described.

5-1. Configuration of Voltage Generation Circuit

Figure 11:
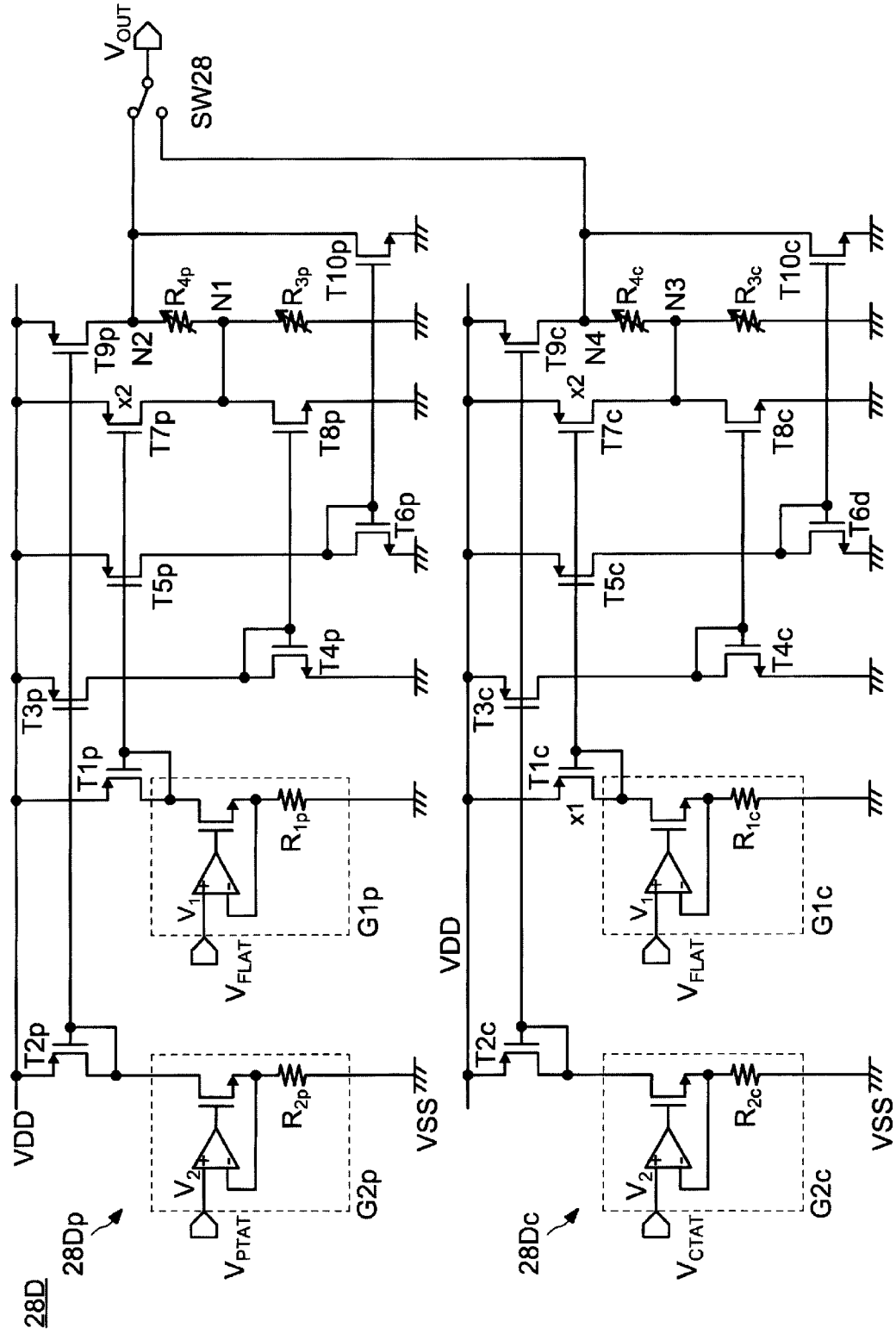
FIG. 11 is a circuit diagram showing a configuration of a voltage generation circuit according to a fifth embodiment.

As shown in FIG. 11, the voltage generation circuit 28D includes a first voltage generation circuit 28Dp, a second voltage generation circuit 28Dc, the output terminal $V_{OUT}$, and a switch SW28. The switch SW28 switches between a connection between the first voltage generation circuit 28Dp and the output terminal $V_{OUT}$ and a connection between the second voltage generation circuit 28Dc and the output terminal $V_{OUT}$.

Each of the first voltage generation circuit 28Dp and the second voltage generation circuit 28Dc has the same configuration as that of the voltage generation circuit 28 according to the first embodiment. When the voltage $V_{PTAT}$ is input to an input terminal of a second current generation circuit G2p of the first voltage generation circuit 28Dp, the second current generation circuit G2p generates the current $I_{PTAT}$. Meanwhile, when the voltage $V_{CTAT}$ is input to an input terminal of a second current generation circuit G2c of the second voltage generation circuit 28Dc, the second current generation circuit G2c generates the current $I_{CTAT}$. When the voltage $V_{FLAT}$ is input to a first current generation circuit G1p of the first voltage generation circuit 28Dp and a first current generation circuit G1c of the second voltage generation circuit 28Dc, the current $I_{FLAT}$ is generated.

In the present embodiment, the first current generation circuits G1p and G1c that generate the current $I_{FLAT}$ are provided in the first voltage generation circuit 28Dp and the second voltage generation circuit 28Dc respectively, but the present disclosure is not limited to this configuration. For example, the current $I_{FLAT}$ generated by the first current generation circuit G1p of the first voltage generation circuit 28Dp may be supplied to the second voltage generation circuit 28Dc. In this case, a pair of transistors T1p and T5c and a pair of transistors T1p and T7c each form a current mirror circuit. In the case of the above configuration, the first current generation circuit G1c and a transistor T1c of the second voltage generation circuit 28Dc are omitted. Contrary to the above configuration, the current $I_{FLAT}$ generated by the first current generation circuit G1c of the second voltage generation circuit 28Dc may be supplied to the first voltage generation circuit 28Dp. In this case, a pair of transistors T1c and T5p and a pair of transistors T1c and T7p each form a current mirror circuit. In the case of the above configuration, the first current generation circuit G1p and the transistor T1p of the first voltage generation circuit 28Dp are omitted.

In the present embodiment, for convenience of explanation, a current generated by the second current generation circuit G2p is referred to as a "first current $I_{PTAT}$", and a current generated by the first current generation circuit G1p is referred to as a "second current $I_{FLAT}$". A current generated by the second current generation circuit G2c is referred to as a "third current $I_{CTAT}$", and a current generated by the first current generation circuit G1c is referred to as a "fourth current $I_{FLAT}$". Variable resistors provided in the first voltage generation circuit 28Dp are referred to as a first variable resistor $R_{3p}$ and a second variable resistor $R_{4p}$. Variable resistors provided in the second voltage generation circuit 28Dc are referred to as a third variable resistor $R_{3c}$ and a fourth variable resistor $R_{4c}$. In the first voltage generation circuit 28Dp, the first variable resistor $R_{3p}$ and the second variable resistor $R_{4p}$ are connected in series. In the second voltage generation circuit 28Dc, the third variable resistor $R_{3c}$ and the fourth variable resistor $R_{4c}$ are connected in series.

In other words, the first voltage generation circuit 28Dp generates the first current $I_{PTAT}$ having a temperature-dependent characteristic (the first temperature-dependent characteristic) in which a current value thereof changes with a predetermined change in temperature, and the second current $I_{FLAT}$ having a temperature-dependent characteristic (the second temperature-dependent characteristic) different from the first temperature-dependent characteristic. The second voltage generation circuit 28Dc generates the third current $I_{CTAT}$ having a temperature-dependent characteristic (a third temperature-dependent characteristic) in which a current value thereof changes in reverse to the first temperature-dependent characteristic with the predetermined change in temperature, and the fourth current $I_{FLAT}$ having a temperature-dependent characteristic (a fourth temperature-dependent characteristic) different from the third temperature-dependent characteristic.

In the present embodiment, the first temperature-dependent characteristic is a temperature-dependent characteristic in which the current value increases with an increase in temperature. The third temperature-dependent characteristic is a temperature-dependent characteristic in which the current value decreases with an increase in temperature. The second temperature-dependent characteristic and the fourth temperature-dependent characteristic are temperature-dependent characteristics in which current values do not change with a change in temperature. Alternatively, the second temperature-dependent characteristic and the fourth temperature-dependent characteristic may be temperature-dependent characteristics in which current values change with a change in temperature.

Figure 12:
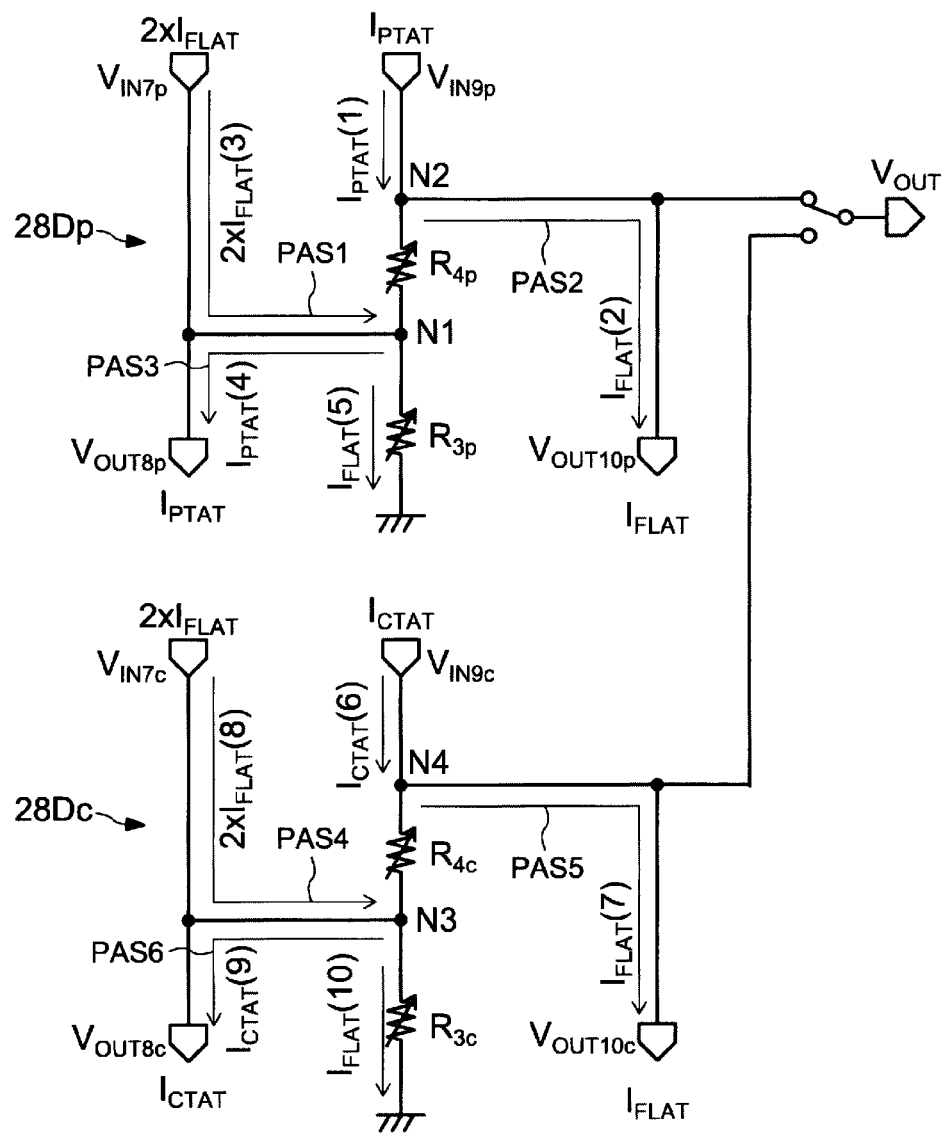
FIG. 12 is a conceptual diagram showing the configuration of the voltage generation circuit according to the fifth embodiment.

FIG. 12 is a conceptual diagram showing a configuration of the voltage generation circuit according to the embodiment. Each of the first voltage generation circuit 28Dp and the second voltage generation circuit 28Dc has the same configuration as that of the voltage generation circuit 28 in FIG. 3.

The first voltage generation circuit 28Dp includes the first path PAS1, the second path PAS2, and the third path PAS3. The first path PAS1 is a path from an input terminal $V_{IN7p}$ (or the first power supply line VDD) to the first node N1 without passing through the second variable resistor $R_{4p}$. The second path PAS2 is a path from the second node N2 to an output terminal $V_{OUT10p}$ (or the second power supply line VSS) without passing through the second variable resistor $R_{4p}$. The third path PAS3 is a path from the first node N1 to the output terminal $V_{OUT8p}$ (or the second power supply line VSS) without passing through the first variable resistor $R_{3p}$.

As shown in FIG. 12, in the first voltage generation circuit 28Dp, a current $2 \times I_{FLAT}$ (3) is input from the input terminal $V_{IN7p}$, a first current $I_{PTAT}$ (1) is input from the input terminal $V_{IN9p}$, a first current $I_{PTAT}$ (4) is output to the output terminal $V_{OUT8p}$, and a second current $I_{FLAT}$ (2) is output to the output terminal $V_{OUT10p}$. Although the details will be described later, a current flowing through the first variable resistor $R_{3p}$ is determined to be the current $I_{FLAT}$ (5) due to the above input and output.

The second voltage generation circuit 28Dc includes a fourth path PAS4, a fifth path PAS5, and a sixth path PAS6. The fourth path PAS4 is a path from an input terminal $V_{IN7c}$ (or the first power supply line VDD) to a third node N3 without passing through the fourth variable resistor $R_{4c}$. The fifth path PAS5 is a path from a fourth node N4 to an output terminal $V_{OUT10c}$ (or the second power supply line VSS) without passing through the fourth variable resistor $R_{4c}$. The sixth path PAS6 is a path from the third node N3 to an output terminal $V_{OUT8c}$ (or the second power supply line VSS) without passing through the third variable resistor $R_{3c}$.

As in the first voltage generation circuit 28Dp, in the second voltage generation circuit 28Dc, a current $2 \times I_{FLAT}$ (8) is input from the input terminal $V_{IN7c}$, a third current $I_{CTAT}$ (6) is input from the input terminal $V_{IN9c}$, a third current $I_{CTAT}$ (9) is output to the output terminal $V_{OUT8c}$, and a fourth current $I_{FLAT}$ (7) is output to the output terminal $V_{OUT10c}$. Although the details will be described later, a current flowing through the third variable resistor $R_{3c}$ is determined to be a current $I_{FLAT}$ (10) due to the above input and output.

In the first voltage generation circuit 28Dp, a current $(I_{R3p})$ flowing through the first variable resistor $R_{3p}$ and a current $(I_{R4p})$ flowing through the second variable resistor $R_{4p}$ are expressed as in the following Equations (5-1) and (5-2), respectively.

$$I_{R4p} = I_{PTAT}(1) - I_{FLAT}(2) \quad (5\text{-}1)$$

$$I_{R3p} = 2 \times I_{FLAT}(3) + (I_{PTAT}(1) - I_{FLAT}(2)) - I_{PTAT}(4) \quad (5\text{-}2)$$

In the case of Equation (5-2), the term of $I_{PTAT}$ disappears and only $I_{FLAT}$ remains. As described above, the remaining $I_{FLAT}$ is referred to as $I_{FLAT}$ (5). That is, in the first voltage generation circuit 28Dp, the current $(I_{R3p})$ flowing through the first variable resistor $R_{3p}$ is $I_{FLAT}$ (5). $I_{FLAT}$ (5) is equivalent to the second current $I_{FLAT}$ generated by the first current generation circuit G1p.

In the second voltage generation circuit 28Dc, a current $(I_{R3c})$ flowing through the third variable resistor $R_{3c}$ and a current $(I_{R4c})$ flowing through the fourth variable resistor $R_{4c}$ are expressed as in the following Equations (5-3) and (5-4), respectively.

$$I_{R4c} = I_{CTAT}(6) - I_{FLAT}(7) \quad (5\text{-}3)$$

$$I_{R3c} = 2 \times I_{FLAT}(8) + (I_{CTAT}(6) - I_{FLAT}(7)) - I_{CTAT}(9) \quad (5\text{-}4)$$

In the case of Equation (5-4), the term of $I_{CTAT}$ disappears and only $I_{FLAT}$ remains. As described above, the remaining $I_{FLAT}$ is referred to as $I_{FLAT}$ (10). That is, in the second voltage generation circuit 28Dc, the current $(I_{R3c})$ flowing through the third variable resistor $R_{3c}$ is $I_{FLAT}$ (10). $I_{FLAT}$ (10) is equivalent to the fourth current $I_{FLAT}$ generated by the second voltage generation circuit 28Dc.

In other words, in the first voltage generation circuit 28Dp, the current flowing through the first variable resistor $R_{3p}$ is the second current $I_{FLAT}$ ($I_{FLAT}$ (5)). A current flowing through the second variable resistor $R_{4p}$ is a current ($I_{PTAT}$ (1)–$I_{FLAT}$ (2)) based on a difference between the first current $I_{PTAT}$ and the second current $I_{FLAT}$. Similarly, in the second voltage generation circuit 28Dc, the current flowing through the third variable resistor $R_{3c}$ is the fourth current $I_{FLAT}$ ($I_{FLAT}$ (10)). A current flowing through the fourth variable resistor $R_{4c}$ is a current ($I_{CTAT}$ (6)–$I_{FLAT}$ (7)) based on a difference between the third current $I_{CTAT}$ and the fourth current $I_{FLAT}$.

Furthermore, in the first voltage generation circuit 28Dp, a current flowing through the first path PAS1 is the current ($2 \times I_{FLAT}$(3)) that is twice the second current $I_{FLAT}$, a current flowing through the second path PAS2 is the second current $I_{FLAT}$ (2), and a current flowing through the third path PAS3 is the first current $I_{PTAT}$ (4). Similarly, in the second voltage generation circuit 28Dc, a current flowing through the fourth path PAS4 is the current ($2 \times I_{FLAT}$(8)) that is twice the fourth current, a current flowing through the fifth path PAS5 is the fourth current $I_{FLAT}$ (7), and a current flowing through the sixth path PAS6 is the third current $I_{CTAT}$ (9). The current flowing through the first path PAS1 and the current flowing through the fourth path PAS4 may be currents ($n \times I_{FLAT}$) that are n times the second current $I_{FLAT}$ and the fourth current $I_{FLAT}$ (n is a positive number excluding 1), respectively.

5-2. Output of Voltage Generation Circuit 28D

A voltage of the output terminal $V_{OUT}$ differs when the switch SW28 is connected to the first voltage generation circuit 28Dp and when the switch SW28 is connected to the second voltage generation circuit 28Dc. The voltage output by each of the first voltage generation circuit 28Dp and the second voltage generation circuit 28Dc is calculated as follows.

5-2-1. Output of First Voltage Generation Circuit 28Dp

Based on Equations (5-1) and (5-2), the voltage of the output terminal $V_{OUT}$ when the switch SW28 is connected to the first voltage generation circuit 28Dp is calculated by the following Equation (5-5).

$$V_{OUT} = R_{3p} \cdot I_{FLAT}(5) + R_{4p} \cdot (I_{PTAT}(1) - I_{FLAT}(2)) \quad (5\text{-}5)$$

5-2-2. Output of Second Voltage Generation Circuit 28Dc

Based on Equations (5-3) and (5-4), the voltage of the output terminal $V_{OUT}$ when the switch SW28 is connected to the second voltage generation circuit 28Dc is calculated as in the following Equation (5-6).

$$V_{OUT} = R_{3c} \cdot I_{FLAT}(10) + R_{4c} \cdot (I_{CTAT}(6) - I_{FLAT}(7)) \quad (5\text{-}6)$$

As shown in Equation (5-5), the current flowing through the first variable resistor $R_{3p}$ is the second current $I_{FLAT}$ (5), and the current flowing through the second variable resistor $R_{4p}$ is a current based on a difference between the first current $I_{PTAT}$ (1) and the second current $I_{FLAT}$ (2). As shown in Equation (5-6), a current flowing through the third variable resistor $R_{3c}$ is the fourth current $I_{FLAT}$ (10), and the current flowing through the fourth variable resistor $R_{4c}$ is a current based on a difference between the third current $I_{CTAT}$ (6) and the fourth current $I_{FLAT}$ (7). As shown in Equation (5-5), when $I_{PTAT} = I_{FLAT}$ at a certain temperature Temp1, the term of $R_4$ is zero. As shown in Equation (5-6), when $I_{CTAT} = I_{FLAT}$ at a certain temperature Temp1, the term of $R_{4c}$ is zero.

Therefore, as in the voltage generation circuit 28 according to the first embodiment, the voltage generation circuit 28D according to the present embodiment can adjust an absolute value of the output voltage $V_{OUT}$ at a certain temperature by values of the first variable resistor $R_{3p}$ and the third variable resistor $R_{3c}$, and can adjust a temperature gradient of the output voltage $V_{OUT}$ by values of the second variable resistor $R_{4p}$ and the fourth variable resistor $R_{4c}$. Since the values of the first variable resistor $R_{3p}$, the second variable resistor $R_{4p}$, the third variable resistor $R_{3c}$, and the fourth variable resistor $R_{4c}$ can be independently controlled, the absolute value of the output voltage $V_{OUT}$ and the temperature gradient of the output voltage $V_{OUT}$ can be independently adjusted. Further, by switching the switch SW28, it is possible to supply both the output voltage $V_{OUT}$ in which the voltage value increases with an increase in temperature and the output voltage $V_{OUT}$ in which the voltage value decreases with the increase in temperature.

6. Sixth Embodiment

A voltage generation circuit according to a sixth embodiment will be described with reference to FIGS. 13 and 14. A voltage generation circuit 28E according to the sixth embodiment is similar to the voltage generation circuit 28D according to the fifth embodiment. In the following description, a description of the same configuration as that of the voltage generation circuit 28D according to the fifth embodiment will be omitted, and differences from the voltage generation circuit 28D will be mainly described.

6-1. Configuration of Voltage Generation Circuit

Figure 13:
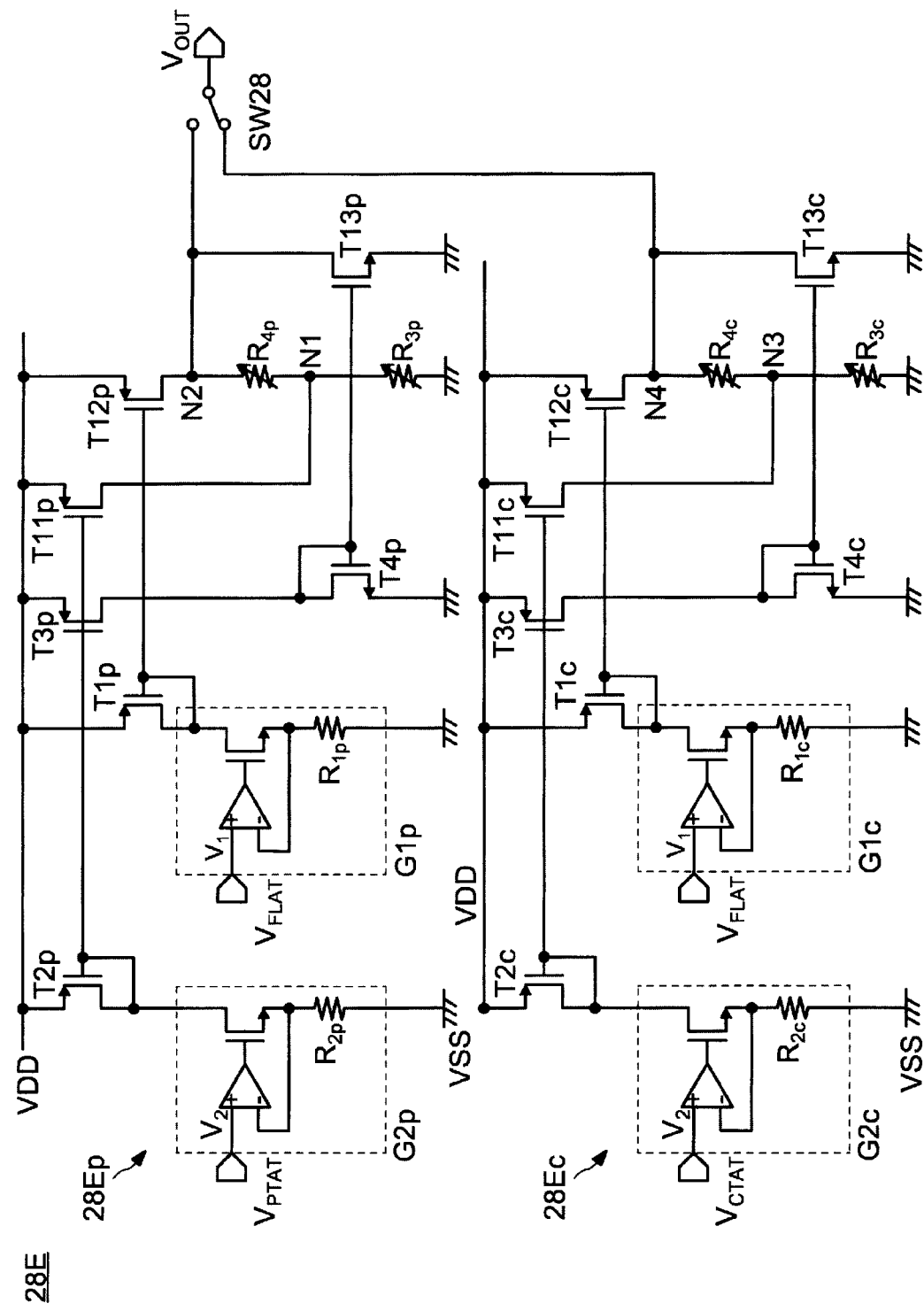
FIG. 13 is a circuit diagram showing a configuration of a voltage generation circuit according to a sixth embodiment.

As shown in FIG. 13, the voltage generation circuit 28E includes a first voltage generation circuit 28Ep, a second voltage generation circuit 28Ec, the output terminal $V_{OUT}$, and the switch SW28. The switch SW28 switches between a connection between the first voltage generation circuit 28Ep and the output terminal $V_{OUT}$ and a connection between the second voltage generation circuit 28Ec and the output terminal $V_{OUT}$.

Each of the first voltage generation circuit 28Ep and the second voltage generation circuit 28Ec has the same configuration as that of the voltage generation circuit 28A according to the second embodiment. The second current generation circuit G2p provided in the first voltage generation circuit 28Ep and the second current generation circuit G2c provided in the second voltage generation circuit 28Ec have the same configurations as those of the second current generation circuits G2p and G2c according to the fifth embodiment, respectively. Therefore, detailed descriptions of the first voltage generation circuit 28Ep and the second voltage generation circuit 28Ec will be omitted.

In the present embodiment, as in the fifth embodiment, a current generated by the second current generation circuit G2p is referred to as the "first current $I_{PTAT}$", and a current generated by the first current generation circuit G1p is referred to as the "second current $I_{FLAT}$". A current generated by the second current generation circuit G2c is referred to as a "third current $I_{CTAT}$", and a current generated by the first current generation circuit G1c is referred to as a "fourth current $I_{FLAT}$". Variable resistors provided in the first voltage generation circuit 28Ep are referred to as the first variable resistor $R_{3p}$ and the second variable resistor $R_{4p}$. Variable resistors provided in the second voltage generation circuit 28Ec are referred to as the third variable resistor $R_{3c}$ and the fourth variable resistor $R_{4c}$. In the first voltage generation circuit 28Ep, the first variable resistor $R_{3p}$ and the second variable resistor $R_{4p}$ are connected in series. In the second voltage generation circuit 28Ec, the third variable resistor $R_{3c}$ and the fourth variable resistor $R_{4c}$ are connected in series.

In the present embodiment, the first current generation circuits G1p and G1c that generate the current $I_{FLAT}$ are provided in the first voltage generation circuit 28Ep and the second voltage generation circuit 28Ec, respectively, but the present disclosure is not limited to this configuration. For example, the current $I_{FLAT}$ generated by the first current generation circuit G1p of the first voltage generation circuit 28Ep may be supplied to the second voltage generation circuit 28Ec. In this case, a pair of transistors T1p and T12c form a current mirror circuit. In the case of the above configuration, the first current generation circuit G1c and the transistor T1c of the second voltage generation circuit 28Ec are omitted. Contrary to the above configuration, the current $I_{FLAT}$ generated by the first current generation circuit G1c of the second voltage generation circuit 28Ec may be supplied to the first voltage generation circuit 28Ep. In this case, a pair of transistors T1c and T12p form a current mirror circuit. In the case of the above configuration, the first current generation circuit G1p and the transistor T1p of the first voltage generation circuit 28Ep are omitted.

Figure 14:
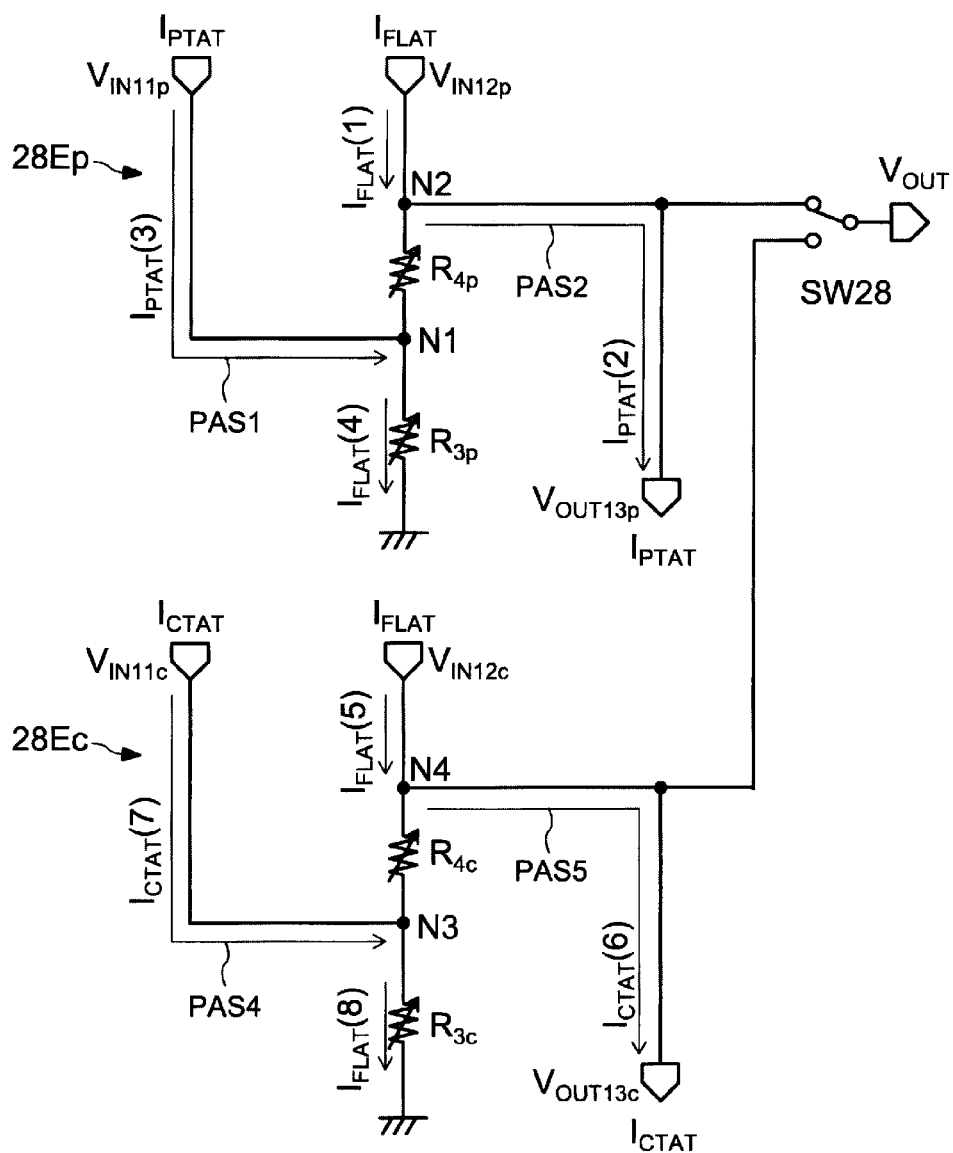
FIG. 14 is a conceptual diagram showing the configuration of the voltage generation circuit according to the sixth embodiment.

FIG. 14 is a conceptual diagram showing a configuration of the voltage generation circuit according to the embodiment. Each of the first voltage generation circuit 28Ep and the second voltage generation circuit 28Ec has the same configuration as that of the voltage generation circuit 28A in FIG. 6.

The first voltage generation circuit 28Ep includes the first path PAS1 and the second path PAS2. The first path PAS1 is a path from the input terminal $V_{IN11p}$ (or the first power supply line VDD) to the first node N1 without passing through the second variable resistor $R_{4p}$. The second path PAS2 is a path from the second node N2 to the output terminal $V_{OUT13p}$ (or the second power supply line VSS) without passing through the second variable resistor $R_{4p}$.

As shown in FIG. 14, in the first voltage generation circuit 28Ep, a first current $I_{FLAT}$ (3) is input from the input terminal $V_{IN11p}$, a second current $I_{FLAT}$ (1) is input from the input terminal $V_{IN12p}$, and a first current $I_{PTAT}$ (2) is output to the output terminal $V_{OUT13p}$. Although the details will be described later, a current flowing through the first variable resistor $R_{3p}$ is determined to be the current $I_{FLAT}$ (4) due to the above input and output.

The second voltage generation circuit 28Ec includes the fourth path PAS4 and the fifth path PAS5. The fourth path PAS4 is a path from the input terminal $V_{IN11c}$ (or the first power supply line VDD) to the third node N3 without passing through the fourth variable resistor $R_{4c}$. The fifth path PAS5 is a path from the fourth node N4 to the output terminal $V_{OUT13c}$ (or the second power supply line VSS) without passing through the fourth variable resistor $R_{4c}$.

As in the first voltage generation circuit 28Ep, in the second voltage generation circuit 28Ec, a third current $I_{CTAT}$ (7) is input from the input terminal $V_{IN11c}$, a fourth current $I_{FLAT}$ (5) is input from the input terminal $V_{IN12c}$, and the third current $I_{CTAT}$ (6) is output to the output terminal $V_{OUT13c}$. Although the details will be described later, a current flowing through the third variable resistor $R_{3c}$ is determined to be a current $I_{FLAT}$ (8) due to the above input and output.

In the first voltage generation circuit 28Ep, a current $(I_{R3p})$ flowing through the first variable resistor $R_{3p}$ and a current $(I_{R4p})$ flowing through the second variable resistor $R_{4p}$ are expressed by the following Equations (6-1) and (6-2), respectively.

$$I_{R4p} = I_{FLAT}(1) - I_{PTAT}(2) \tag{6-1}$$

$$I_{R3p} = I_{PTAT}(3) + (I_{FLAT}(1) - I_{PTAT}(2)) \tag{6-2}$$

In this case, since a current of a value based on $I_{FLAT}$ (1)–$I_{PTAT}$ (2) is output to the output terminal $V_{OUT}$, the case of performing such an operation is referred to as "during a CTAT operation".

In the case of Equation (6-2), the term of $I_{PTAT}$ disappears and only $I_{FLAT}$ remains. As described above, the remaining $I_{FLAT}$ is referred to as $I_{FLAT}$ (4). That is, in the first voltage generation circuit 28Ep, the current ($I_{R3p}$) flowing through the first variable resistor $R_{3p}$ is $I_{FLAT}$ (4). $I_{FLAT}$ (4) is equivalent to the second current $I_{FLAT}$ generated by the first current generation circuit G1p.

In the second voltage generation circuit 28Ec, a current ($I_{R3c}$) flowing through the third variable resistor $R_{3c}$ and a current ($I_{R4c}$) flowing through the fourth variable resistor $R_{4c}$ are expressed by the following Equations (6-3) and (6-4), respectively.

$$I_{R4c} = I_{FLAT}(5) - I_{CTAT}(6) \quad (6\text{-}3)$$

$$I_{R3c} = I_{CTAT}(7) + (I_{FLAT}(5) - I_{CTAT}(6)) \quad (6\text{-}4)$$

In this case, since a current of a value based on $I_{FLAT}$ (5)–$I_{CTAT}$ (6) is output to the output terminal $V_{OUT}$, the case of performing such an operation is referred to as "during a PTAT operation".

In the case of Equation (6-4), the term of $I_{CTAT}$ disappears and only $I_{FLAT}$ remains. As described above, the remaining $I_{FLAT}$ is referred to as $I_{FLAT}$ (8). That is, in the second voltage generation circuit 28Ec, the current ($I_{R3c}$) flowing through the third variable resistor $R_{3c}$ is $I_{FLAT}$ (8). $I_{FLAT}$ (8) is equivalent to the fourth current $I_{FLAT}$ generated by the second voltage generation circuit 28Ec.

In other words, in the first voltage generation circuit 28Ep, the current flowing through the first variable resistor $R_{3p}$ is the second current $I_{FLAT}$ ($I_{FLAT}$ (4)). A current flowing through the second variable resistor $R_{4p}$ is a current ($I_{FLAT}$ (1)–$I_{PTAT}$ (2)) based on a difference between the first current $I_{PTAT}$ and the second current $I_{FLAT}$. Similarly, in the second voltage generation circuit 28Ec, the current flowing through the third variable resistor $R_{3c}$ is the fourth current $I_{FLAT}$ ($I_{FLAT}$ (8)). A current flowing through the fourth variable resistor $R_{4c}$ is a current ($I_{FLAT}$ (5)–$I_{CTAT}$ (6)) based on a difference between the third current $I_{CTAT}$ and the fourth current $I_{FLAT}$.

Furthermore, in the first voltage generation circuit 28Ep, a current flowing through the first path PAS1 is the first current $I_{PTAT}$ (3), and a current flowing through the second path PAS2 is the first current $I_{PTAT}$ (2). Similarly, in the second voltage generation circuit 28Ec, a current flowing through the fourth path PAS4 is the third current $I_{CTAT}$ (7), and a current flowing through the fifth path PAS5 is the third current $I_{CTAT}$ (6).

6-2. Output of Voltage Generation Circuit 28E

A voltage of the output terminal $V_{OUT}$ differs when the switch SW28 is connected to the first voltage generation circuit 28Ep and when the switch SW28 is connected to the second voltage generation circuit 28Ec. The voltage output by each of the first voltage generation circuit 28Ep and the second voltage generation circuit 28Ec is calculated as follows.

6-2-1. Output of First Voltage Generation Circuit 28Ep During CTAT Operation

Based on Equations (6-1) and (6-2), the voltage of the output terminal $V_{OUT}$ when the switch SW28 is connected to the first voltage generation circuit 28Ep is calculated by the following Equation (6-5).

$$V_{OUT} = R_{3p} \cdot I_{FLAT}(4) + R_{4p} \cdot (I_{FLAT}(1) - I_{PTAT}(2)) \quad (6\text{-}5)$$

6-2-2. Output of Second Voltage Generation Circuit 28Ec During PTAT Operation

Based on Equations (6-3) and (6-4), the voltage of the output terminal $V_{OUT}$ when the switch SW28 is connected to the second voltage generation circuit 28Ec is calculated as in the following Equation (6-6).

$$V_{OUT} = R_{3c} \cdot I_{FLAT}(8) + R_{4c} \cdot (I_{FLAT}(5) - I_{CTAT}(6)) \quad (6\text{-}6)$$

As shown in Equation (6-5), the current flowing through the first variable resistor $R_{3p}$ is a second current $I_{FLAT}$ (4), and the current flowing through the second variable resistor $R_{4p}$ is a current based on a difference between the first current $I_{PTAT}$ (2) and the second current $I_{FLAT}$ (1). As shown in Equation (6-6), the current flowing through the third variable resistor $R_{3c}$ is a fourth current $I_{FLAT}$ (8), and the current flowing through the fourth variable resistor $R_{4c}$ is a current based on a difference between the third current $I_{CTAT}$ (6) and the fourth current $I_{FLAT}$ (5). As shown in Equation (6-5), when $I_{PTAT} = I_{FLAT}$ at a certain temperature Temp1, the term of $R_{4p}$ is zero. As shown in Equation (6-6), when $I_{CTAT} = I_{FLAT}$ at a certain temperature Temp1, the term of $R_{4c}$ is zero.

Therefore, the voltage generation circuit 28E according to the present embodiment can obtain the same effect as the voltage generation circuit 28D.

7. Seventh Embodiment

A voltage generation circuit according to a seventh embodiment will be described with reference to FIGS. 15 to 17. A voltage generation circuit 28F according to the seventh embodiment is similar to the voltage generation circuit 28 according to the first embodiment. In the following description, a description of the same configuration as that of the voltage generation circuit 28 according to the first embodiment will be omitted, and differences from the voltage generation circuit 28 will be mainly described.

7-1. Configuration of Voltage Generation Circuit

Figure 15:
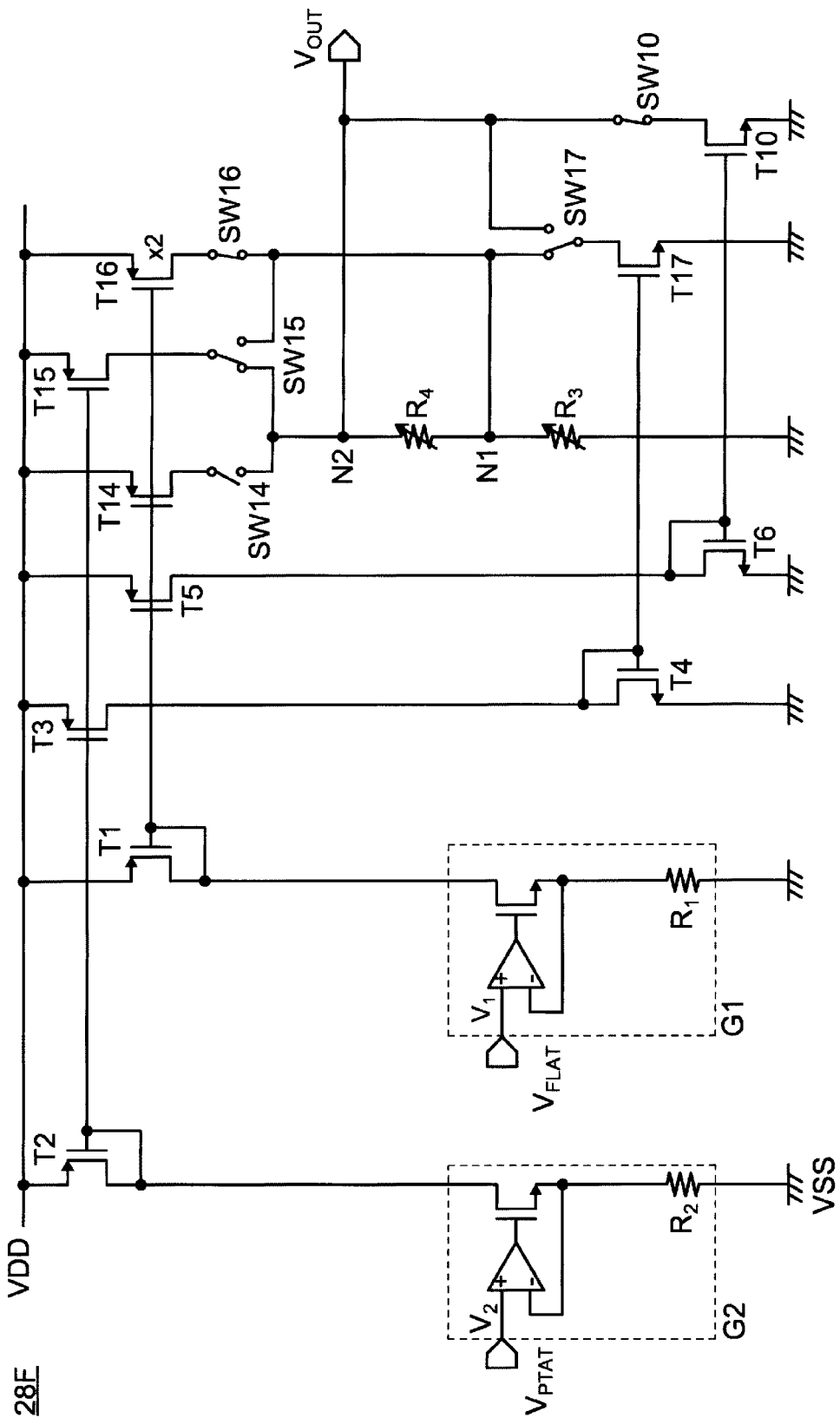
FIG. 15 is a circuit diagram showing a configuration of a voltage generation circuit according to a seventh embodiment.

FIG. 15 is a circuit diagram showing a configuration of the voltage generation circuit according to the embodiment. As shown in FIG. 15, in the voltage generation circuit 28F, transistors T14 to T17 and switches SW10 and SW14 to SW17 are provided instead of the transistors T7 to T9 that are provided in the voltage generation circuit 28 shown in FIG. 2. The transistors T14 to T16 are p-type transistors. The transistor T17 is an n-type transistor. In the present embodiment, when the voltage $V_{PTAT}$ is input to an input terminal of the second current generation circuit G2, the second current generation circuit G2 generates the current $I_{PTAT}$.

The transistor T10 and the switch SW10 are connected in series between the output terminal $V_{OUT}$ and the second power supply line VSS.

The transistor T14 and the switch SW14 are connected in series between the first power supply line VDD and the second node N2. In a state in which the switch SW15 is connected to a second node N2 side, the transistor T15 and the switch SW15 are connected in series between the first power supply line VDD and the second node N2. The transistor T14 and the switch SW14 are connected in parallel with the transistor T15 and the switch SW15 between the first power supply line VDD and the second node N2. A state in which the transistor T14 is connected to the second node N2 and a state in which the transistor T15 is connected to the second node N2 are switched by the switches SW14 and SW15.

In a state in which the switch SW15 is connected to a first node N1 side, the transistor T15 and the switch SW15 are connected in series between the first power supply line VDD and the first node N1. The transistor T16 and the switch SW16 are connected in series between the first power supply line VDD and the first node N1. The transistor T15 and the switch SW15 are connected in parallel with the transistor T16 and the switch SW16 between the first power supply line VDD and the first node N1. A state in which the transistor T15 is connected to the first node N1 and a state in which the transistor T16 is connected to the first node N1 are switched by the switches SW15 and SW16.

In a state in which the switch SW17 is connected to a first node N1 side, the transistor T17 and the switch SW17 are connected in series between the first node N1 and the second power supply line VSS. In a state in which the switch SW17 is connected to the second node N2 side, the transistor T17 and the switch SW17 are connected in series between the second node N2 and the second power supply line VSS. A state in which the transistor T17 is connected to the first node N1 and a state in which the transistor T17 is connected to the second node N2 are switched by the switch SW17.

A pair of transistors T1 and T14, a pair of transistors T1 and T16, a pair of transistors T2 and T15, and a pair of transistors T4 and T17 each form a current mirror circuit. Sizes of the transistors are the same. As the transistor T16 denoted by "×2", two transistors are connected in parallel. In this configuration, a current flowing through the transistor T14 is the current $I_{FLAT}$, a current flowing through the transistor T15 is the current $I_{PTAT}$, a current flowing through the transistor T16 is the current $2 \times I_{FLAT}$, and a current flowing through the transistor T17 is the current $I_{PTAT}$.

Figure 16:
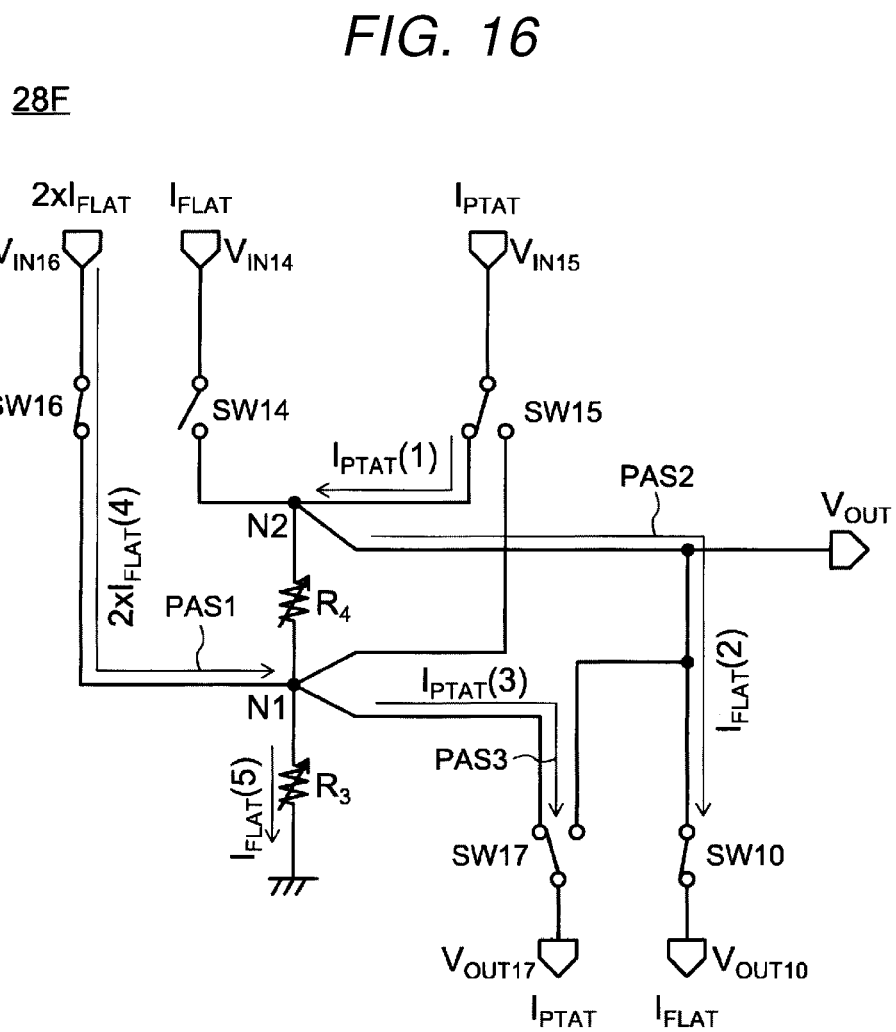
FIG. 16 is a conceptual diagram showing the configuration of the voltage generation circuit according to the seventh embodiment.
Figure 17:
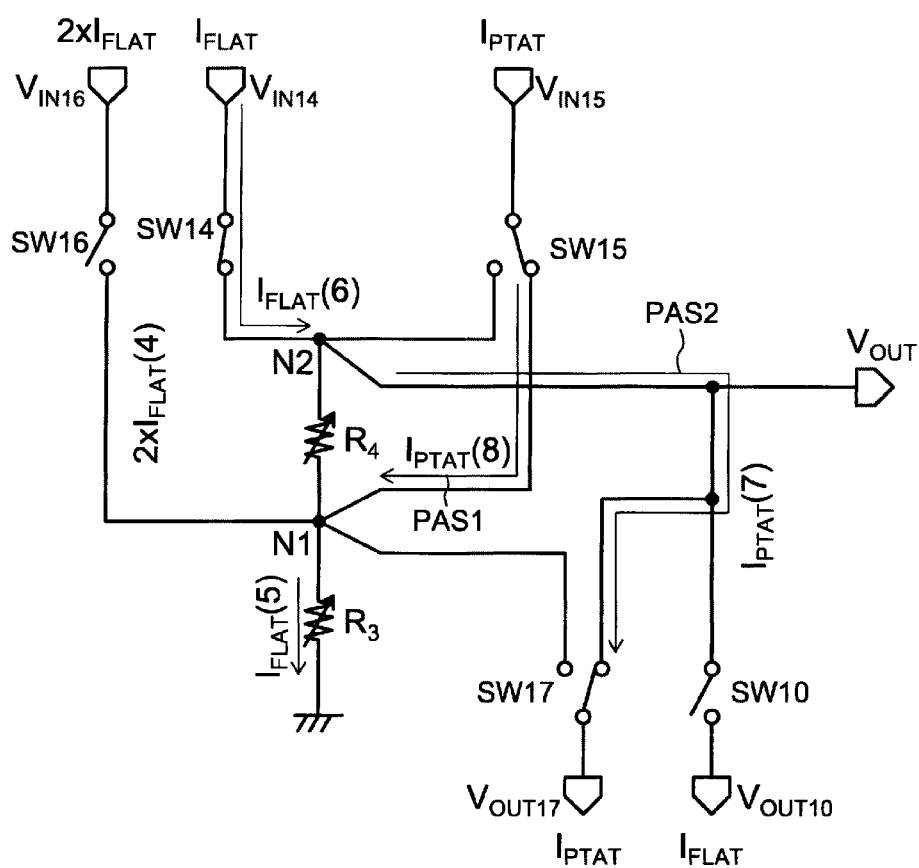
FIG. 17 is a conceptual diagram showing the configuration of the voltage generation circuit according to the seventh embodiment.

FIG. 16 and FIG. 17 are conceptual diagrams showing the configuration of the voltage generation circuit according to the embodiment. The transistors T14, T15, and T16 in FIG. 15 correspond to input terminals $V_{IN14}$, $V_{IN15}$, and $V_{IN16}$ in FIGS. 16 and 17, respectively, and the transistors T10 and T17 in FIG. 15 correspond to output terminals $V_{OUT10}$ and $V_{OUT17}$ in FIGS. 16 and 17, respectively. The current $I_{FLAT}$ is input from the input terminal $V_{IN14}$, the current $I_{PTAT}$ is input from the input terminal $V_{IN15}$, and the current $2 \times I_{FLAT}$ is input from the input terminal $V_{IN16}$. The current $I_{FLAT}$ is output to the output terminal $V_{OUT10}$, and the current $I_{PTAT}$ is output to the output terminal $V_{OUT17}$.

An input terminal connected to the second node N2 is switched to the input terminal $V_{IN14}$ or the input terminal $V_{IN15}$, and a current supplied to the second node N2 is switched to the current $I_{FLAT}$ or the current $I_{PTAT}$ by the switches SW14 and SW15. An input terminal connected to the first node N1 is switched to the input terminal $V_{IN15}$ or the input terminal $V_{IN16}$, and a current supplied to the first node N1 is switched to the current $I_{PTAT}$ or $2 \times I_{FLAT}$ by the switches SW15 and SW16.

The switches SW10 and SW14 to SW17 are interlocked with one another. As shown in FIG. 16, when the switch SW10 is in an ON state (a conductive state), the switch SW14 is in an OFF state (a non-conductive state), the switch SW15 is connected to the second node N2 side, the switch SW16 is in the ON state, and the switch SW17 is connected to the first node N1 side. As shown in FIG. 17, when the switch SW10 is in the OFF state, the switch SW14 is in the ON state, the switch SW15 is connected to the first node N1 side, the switch SW16 is in the OFF state, and the switch SW17 is connected to the second node N2 side.

As shown in FIGS. 16 and 17, the voltage generation circuit 28F includes the first path PAS1, the second path PAS2, and the third path PAS3. The first path PAS1 is a path from the input terminal $V_{IN16}$ (or the first power supply line VDD) to the first node N1 without passing through the second variable resistor $R_4$, and a path from the input terminal $V_{IN15}$ (or the first power supply line VDD) to the first node N1 without passing through the second variable resistor $R_4$. The second path PAS2 is a path from the second node N2 to the output terminal $V_{OUT10}$ or the output terminal $V_{OUT17}$ (or the second power supply line VSS) without passing through the second variable resistor $R_3$. The third path PAS3 is a path from the first node N1 to the output terminal $V_{OUT17}$ (or the second power supply line VSS) without passing through the first variable resistor $R_3$.

As shown in FIG. 16, the current $I_{PTAT}$ (1) is supplied from the input terminal $V_{IN15}$ to the second node N2, a current $2 \times I_{FLAT}$ (4) is supplied from the input terminal $V_{IN16}$ to the first node N1, the current $I_{FLAT}$ (2) is output from the second node N2 to the output terminal $V_{OUT10}$, and the current $I_{PTAT}$ (3) is output from the first node N1 to the output terminal $V_{OUT17}$. Although the details will be described later, the current flowing through the first variable resistor $R_3$ is determined to be the current $I_{FLAT}$ (5) due to the above input and output.

As shown in FIG. 17, a current $I_{FLAT}$ (6) is supplied from the input terminal $V_{IN14}$ to the second node N2, a current $I_{PTAT}$ (8) is supplied from the input terminal $V_{IN15}$ to the first node N1, and a current $I_{PTAT}$ (7) is output from the second node N2 to the output terminal $V_{OUT17}$. Although the details will be described later, the current flowing through the first variable resistor $R_3$ is determined to be the current $I_{FLAT}$ (5) due to the above input and output.

In the state shown in FIG. 16, a current $(I_{R3})$ flowing through the first variable resistor $R_3$ and a current $(I_{R4})$ flowing through the second variable resistor $R_4$ are expressed by the following Equations (7-1) and (7-2), respectively.

$$I_{R4}=I_{PTAT}(1)-I_{FLAT}(2) \qquad (7\text{-}1)$$

$$I_{R3}=2 \times I_{FLAT}(4)+(I_{PTAT}(1)-I_{FLAT}(2))-I_{PTAT}(3) \qquad (7\text{-}2)$$

In this case, since a current of a value based on $I_{PTAT}$ (1)–$I_{FLAT}$ (2) is output to the output terminal $V_{OUT}$, the case of performing such an operation is referred to as "during a PTAT operation".

In the state shown in FIG. 17, a current $(I_{R3})$ flowing through the first variable resistor $R_3$ and a current $(I_{R4})$ flowing through the second variable resistor $R_4$ are expressed by the following Equations (7-3) and (7-4), respectively.

$$I_{R4}=I_{FLAT}(6)-I_{PTAT}(7) \qquad (7\text{-}3)$$

$$I_{R3}=I_{PTAT}(8)+(I_{FLAT}(6)-I_{PTAT}(7)) \qquad (7\text{-}4)$$

In this case, since a current of a value based on $I_{FLAT}$ (6)–$I_{PTAT}$ (7) is output to the output terminal $V_{OUT}$, the case of performing such an operation is referred to as "during a CTAT operation".

In the case of Equation (7-2), the term of $I_{PTAT}$ disappears and only $I_{FLAT}$ remains. In the case of Equation (7-4), the term of $I_{PTAT}$ disappears and only $I_{FLAT}$ remains. As described above, the remaining $I_{FLAT}$ is referred to as $I_{FLAT}$ (5). That is, the current $(I_{R3})$ flowing through the first variable resistor $R_3$ is $I_{FLAT}$ (5) even in the case of both "during the PTAT operation" and "during the CTAT operation".

In other words, "during the PTAT operation" shown in FIG. 16, when a current supplied to the second node N2 is the current $I_{PTAT}$ (1), a current flowing through the first path PAS1 is the current ($2 \times I_{FLAT}$ (4)) that is twice the current $I_{FLAT}$, a current flowing through the second path PAS2 is the current $I_{FLAT}$ (2), and a current flowing through the third path PAS3 is the current $I_{PTAT}$ (3). The current flowing through the first path PAS1 may be a current ($n \times I_{FLAT}$) that is n times the current $I_{FLAT}$ (n is a positive number excluding 1).

"During the CTAT operation" shown in FIG. 17, when a current supplied to the second node N2 is the current $I_{FLAT}$ (6), the current flowing through the first path PAS1 is the current $I_{PTAT}$ (8), the current flowing through the second path PAS2 is the current $I_{PTAT}$ (7), and the third path PAS3 is cut off.

7-2. Output of Voltage Generation Circuit

A voltage of the output terminal $V_{OUT}$ differs during the PTAT operation and during the CTAT operation. In each case, the voltage of the output terminal $V_{OUT}$ is calculated as follows.

7-2-1. Output of Voltage Generation Circuit During PTAT Operation

Based on Equations (7-1) and (7-2), the voltage of the output terminal $V_{OUT}$ is calculated as in the following Equation (7-5).

$$V_{OUT}=R_3 \cdot I_{FLAT}(5)+R_4 \cdot (I_{PTAT}(1)-I_{FLAT}(2)) \tag{7-5}$$

7-2-2. Output of Voltage Generation Circuit During CTAT Operation

Based on Equations (7-3) and (7-4), the voltage of the output terminal $V_{OUT}$ is calculated as in the following Equation (7-6).

$$V_{OUT}=R_3 \cdot I_{FLAT}(5)+R_4 \cdot (I_{FLAT}(6)-I_{PTAT}(7)) \tag{7-6}$$

As shown in Equations (7-5) and (7-6), the current flowing through the first variable resistor $R_3$ is the current $I_{FLAT}$ (5), and a current flowing through the second variable resistor $R_4$ is a current based on a difference between the current $I_{PTAT}$ (1) and the current $I_{FLAT}$ (2) or a current based on a difference between the current $I_{PTAT}$ (7) and the current $I_{FLAT}$ (6). As shown in Equations (7-5) and (7-6), when $I_{PTAT}=I_{FLAT}$ at a certain temperature Temp1, the term of $R_4$ is zero.

Therefore, the voltage generation circuit 28F according to the present embodiment can obtain the same effect as the voltage generation circuit 28 according to the first embodiment. Further, by switching the switches SW10 and SW14 to SW17, it is possible to supply both the output voltage $V_{OUT}$ in which the voltage value increases with an increase in temperature and the output voltage $V_{OUT}$ in which the voltage value decreases with the increase in temperature.

8. Eighth Embodiment

A voltage generation circuit according to an eighth embodiment will be described with reference to FIGS. 18 and 19. A voltage generation circuit 28G according to the eighth embodiment has substantially the same circuit configuration as that of the voltage generation circuit 28F according to the seventh embodiment, and is different from the voltage generation circuit 28F in a switching method of the switches SW10 and SW14 to SW17. In the following description, a description of the same configuration as that of the voltage generation circuit 28F according to the seventh embodiment will be omitted, and differences from the voltage generation circuit 28F will be mainly described.

Figure 18:
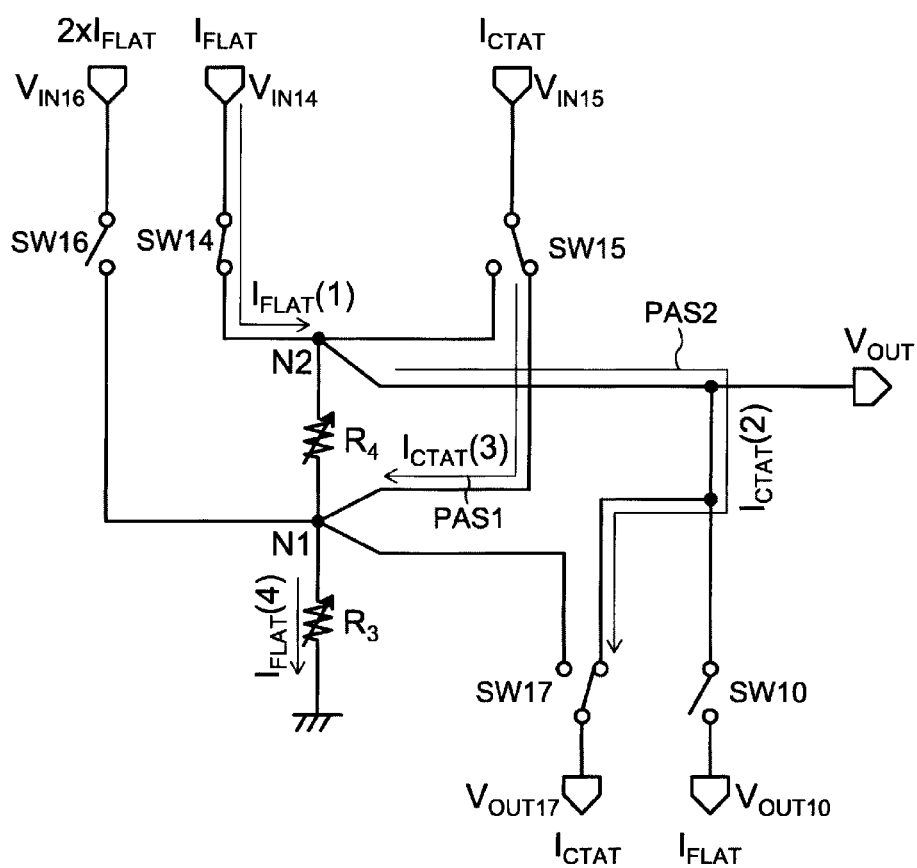
FIG. 18 is a conceptual diagram showing a configuration of a voltage generation circuit according to an eighth embodiment.
Figure 19:
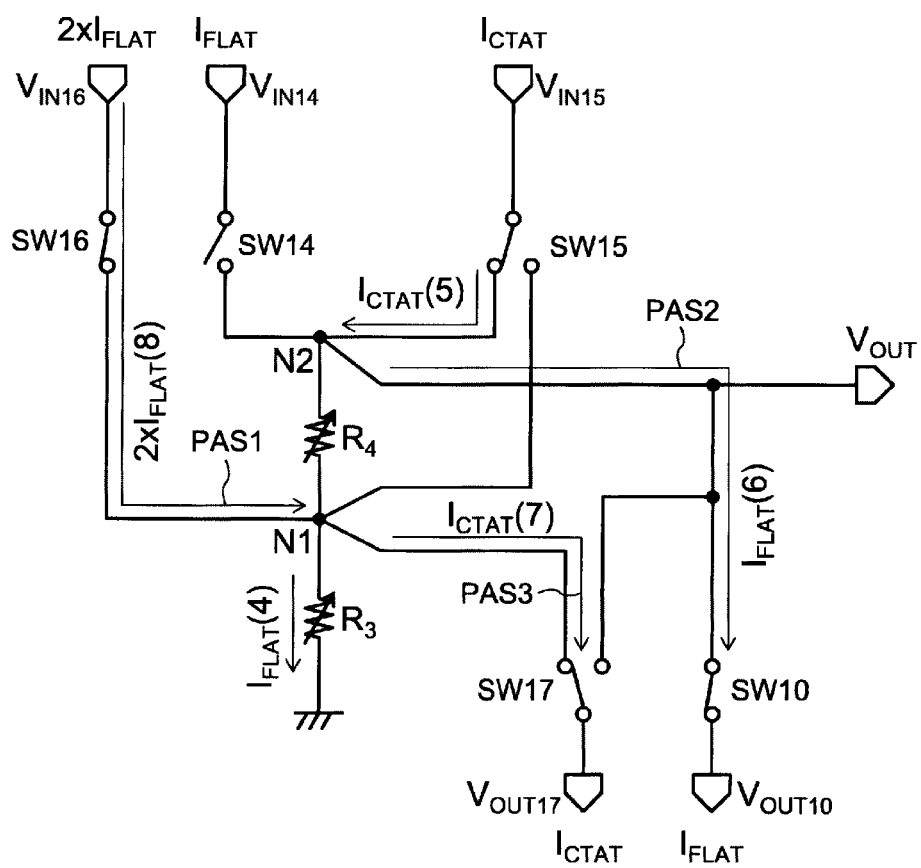
FIG. 19 is a conceptual diagram showing the configuration of the voltage generation circuit according to the eighth embodiment.

FIGS. 18 and 19 are conceptual diagrams showing a configuration of the voltage generation circuit according to the embodiment. A correspondence relationship between each transistor shown in FIG. 15 and each input terminal and each output terminal shown in FIGS. 18 and 19 is the same as that of the seventh embodiment.

In the present embodiment, when the voltage $V_{CTAT}$ is input to an input terminal of the second current generation circuit G2, the second current generation circuit G2 generates the current $I_{CTAT}$. Therefore, the current $I_{CTAT}$ is supplied from the input terminal $V_{IN15}$, and the current $I_{CTAT}$ is output to the output terminal $V_{OUT17}$.

As shown in FIG. 18, the current $I_{FLAT}$ (1) is supplied from the input terminal $V_{IN14}$ to the second node N2, a current $I_{CTAT}$ (3) is supplied from the input terminal $V_{IN15}$ to the first node N1, and a current $I_{CTAT}$ (2) is output from the second node N2 to the output terminal $V_{OUT17}$. Although the details will be described later, a current flowing through the first variable resistor $R_3$ is determined to be a current $I_{FLAT}$ (4) due to the above input and output.

As shown in FIG. 19, the current $I_{CTAT}$ (5) is supplied from the input terminal $V_{IN15}$ to the second node N2, the current $2 \times I_{FLAT}$ (8) is supplied from the input terminal $V_{IN16}$ to the first node N1, the current $I_{FLAT}$ (6) is output from the second node N2 to the output terminal $V_{OUT10}$, and the current $I_{CTAT}$ (7) is output from the first node N1 to the output terminal $V_{OUT17}$. Although the details will be described later, a current flowing through the first variable resistor $R_3$ is determined to be a current $I_{FLAT}$ (4) due to the above input and output.

In the state shown in FIG. 18, a current ($I_{R3}$) flowing through the first variable resistor $R_3$ and a current ($I_{R4}$) flowing through the second variable resistor $R_4$ are expressed by the following Equations (8-1) and (8-2), respectively.

$$I_{R4}=I_{FLAT}(1)-I_{CTAT}(2) \tag{8-1}$$

$$I_{R3}=I_{FLAT}(1)-I_{CTAT}(2)+I_{CTAT}(3) \tag{8-2}$$

In this case, since a current of a value based on $I_{FLAT}$ (1)$-I_{CTAT}$ (2) is output to the output terminal $V_{OUT}$, the case of performing such an operation is referred to as "during a PTAT operation".

In the state shown in FIG. 19, the current ($I_{R3}$) flowing through the first variable resistor $R_3$ and the current ($I_{R4}$) flowing through the second variable resistor $R_4$ are expressed as in the following Equations (8-3) and (8-4), respectively.

$$I_{R4}=I_{CTAT}(5)-I_{FLAT}(6) \tag{8-3}$$

$$I_{R3}=2 \times I_{FLAT}(8)+I_{CTAT}(5)-I_{FLAT}(6)-I_{CTAT}(7) \tag{8-4}$$

In this case, since a current of a value based on $I_{CTAT}$ (5)$-I_{FLAT}$ (6) is output to the output terminal $V_{OUT}$, the case of performing such an operation is referred to as "during a CTAT operation".

In the case of Equation (8-2), the term of $I_{CTAT}$ disappears and only $I_{FLAT}$ remains. In the case of Equation (8-4), the term of $I_{CTAT}$ disappears and only $I_{FLAT}$ remains. As described above, the remaining $I_{FLAT}$ is referred to as $I_{FLAT}$ (4). That is, the current ($I_{R3}$) flowing through the first variable resistor $R_3$ is $I_{FLAT}$ (4) even in the case of both "during the PTAT operation" and "during the CTAT operation".

In other words, "during the PTAT operation" shown in FIG. 18, when a current supplied to the second node N2 is the current $I_{FLAT}$ (1), a current flowing through the first path PAS1 is the current $I_{CTAT}$ (3), a current flowing through the second path PAS2 is the current $I_{CTAT}$ (2), and the third path PAS3 is cut off.

"During the CTAT operation" shown in FIG. 19, when the current supplied to the second node N2 is the current $I_{CTAT}$ (5), the current flowing through the first path PAS1 is a current ($2 \times I_{FLAT}$ (8)) that is twice the current $I_{FLAT}$, the current flowing through the second path PAS2 is the current $I_{FLAT}$ (6), and a current flowing through the third path PAS3 is the current $I_{CTAT}$ (7). The current flowing through the first path PAS1 may be a current ($n \times I_{FLAT}$) that is n times the current $I_{FLAT}$ (n is a positive number excluding 1).

8-2. Output of Voltage Generation Circuit

A voltage of the output terminal $V_{OUT}$ differs during the PTAT operation and during the CTAT operation. In each case, the voltage of the output terminal $V_{OUT}$ is calculated as follows.

8-2-1. Output of Voltage Generation Circuit During PTAT Operation

Based on Equations (8-1) and (8-2), the voltage of the output terminal $V_{OUT}$ is calculated as in the following Equation (8-5).

$$V_{OUT} = R_3 \cdot I_{FLAT}(4) + R_4 \cdot (I_{FLAT}(1) - I_{CTAT}(2)) \tag{8-5}$$

8-2-2. Output of Voltage Generation Circuit During CTAT Operation

Based on Equations (8-3) and (8-4), the voltage of the output terminal $V_{OUT}$ is calculated as in the following Equation (8-6).

$$V_{OUT} = R_3 \cdot I_{FLAT}(4) + R_4 \cdot (I_{CTAT}(5) - I_{FLAT}(6)) \tag{8-6}$$

As shown in Equations (8-5) and (8-6), a current flowing through the first variable resistor $R_3$ is the current $I_{FLAT}$ (4), and a current flowing through the second variable resistor $R_4$ is a current based on a difference between the current $I_{FLAT}$ (1) and the current $I_{CTAT}$ (2) or a current based on a difference between the current $I_{CTAT}$ (5) and the current $I_{FLAT}$ (6). As shown in Equations (8-5) and (8-6), when $I_{CTAT} = I_{FLAT}$ at a certain temperature Temp1, the term of $R_4$ is zero.

Therefore, the voltage generation circuit 28G according to the present embodiment can obtain the same effect as the voltage generation circuit 28F according to the seventh embodiment.

While certain embodiments have been described with reference to the accompanying drawings, these embodiments are not intended to limit the scope of the disclosure, and may be embodied in a variety of other forms. For example, a device to which additions, omissions, or modifications of elements are made by those skilled in the art based on the voltage generation circuit according to the present embodiment falls within the scope of the present disclosure as long as the gist of the present disclosure is provided. Further, the embodiments may be appropriately combined if there is no contradiction with each other, and technical matters common to each embodiment are included in each embodiment even if there is no explicit description.

Even with other actions and effects different from the actions and effects brought about by the aspects of the above-described embodiments, it is understood that, as a matter of course, actions and effects apparent from the description of the present specification, or actions and effects that can be easily predicted by those skilled in the art are brought about by the present disclosure.

What is claimed is:

1. A voltage generation circuit that generates a first current having a first temperature-dependent characteristic in which a current value thereof changes with a predetermined change in temperature, and a second current having a second temperature-dependent characteristic different from the first temperature-dependent characteristic, the voltage generation circuit comprising:
   a first power supply line to which a first power supply voltage is supplied;
   a second power supply line to which a second power supply voltage lower than the first power supply voltage is supplied;
   an output terminal;
   a first variable resistor through which the second current flows, and a second variable resistor through which a third current flows;
   a first current path from the first power supply line to a first node between the first variable resistor and the second variable resistor;
   a second current path from a second node between the second variable resistor and the first power supply line to the second power supply line; and
   a third current path from the first node to the second power supply line, wherein;
   the first variable resistor and the second variable resistor are connected in series between the first power supply line and the second power supply line and between the output terminal and the second power supply line;
   the second temperature-dependent characteristic is a characteristic in which a current value of the second current does not change with the predetermined change in temperature;
   the third current has a current value that is based on a difference between a current value of the first current and a current value of the second current; and
   when the first current is supplied to the second node,
      a current flowing through the first current path has a current value that is n times the current value of the second current, where n is a positive number excluding 1, and
      the second current flows through the second current path, and the first current flows through the third current path.

2. A voltage generation circuit that generates a first current having a first temperature-dependent characteristic in which a current value thereof changes with a predetermined change in temperature, and a second current having a second temperature-dependent characteristic different from the first temperature-dependent characteristic, the voltage generation circuit comprising:
   a first power supply line to which a first power supply voltage is supplied;
   a second power supply line to which a second power supply voltage lower than the first power supply voltage is supplied;
   an output terminal;
   a first variable resistor through which the second current flows, and a second variable resistor through which a third current flows;
   a first current path from the first power supply line to a first node between the first variable resistor and the second variable resistor; and
   a second current path from a second node between the second variable resistor and the first power supply line to the second power supply line, wherein:
   the first variable resistor and the second variable resistor are connected in series between the first power supply line and the second power supply line and between the output terminal and the second power supply line;
   the second temperature-dependent characteristic is a characteristic in which a current value of the second current does not change with the predetermined change in temperature;

the third current has a current value that is based on a difference between a current value of the first current and a current value of the second current; and when a current supplied to the first node through the first current path is the first current, the first current also flows through the second current path.

3. The voltage generation circuit according to claim 1, wherein the voltage generation circuit further generates a fourth current having a third temperature-dependent characteristic in which a current value thereof changes in reverse to the first temperature-dependent characteristic with the predetermined change in temperature, and when the fourth current is supplied to the second node, the current flowing through the first current path has a current value that is n times the current value of the second current, and the second current flows through the second current path, and the third fourth current flows through the third current path.

4. The voltage generation circuit according to claim 2, wherein the voltage generation circuit further generates a fourth current having a third temperature-dependent characteristic in which a current value thereof changes in reverse to the first temperature-dependent characteristic with the predetermined change in temperature, and when the current supplied to the first node through the first current path is the fourth current, the fourth current flows through the second current path.

5. The voltage generation circuit according to claim 1, wherein the first temperature-dependent characteristic is a characteristic in which a current value increases with an increase in temperature, and when the current supplied to the second node is the second current, the first current flows through the first current path,
the first current flows through the second current path, and
the third current path is cut off.

6. The voltage generation circuit according to claim 1, wherein the first temperature-dependent characteristic is a characteristic in which a current value decreases with an increase in temperature, and when a current supplied to the second node is the second current, the first current flows through the first current path,
the first current flows through the second current path, and
the third current path is cut off.

7. A semiconductor memory device according to comprising:

a memory cell array; and a voltage generation circuit configured to generate voltages necessary to carry out operations on one or more memory cells of the memory cell array, and to generate a first current having a first temperature-dependent characteristic in which a current value thereof changes with a predetermined change in temperature, a second current having a second temperature-dependent characteristic different from the first temperature-dependent characteristic, and a third current having a third temperature-dependent characteristic in which a current value thereof changes in reverse to the first temperature-dependent characteristic with the predetermined change in temperature, wherein the voltage generation circuit includes:

a first power supply line to which a first power supply voltage is supplied;

a second power supply line to which a second power supply voltage lower than the first power supply voltage is supplied;

a first variable resistor and a second variable resistor connected in series;

a first current path from the first power supply line to a first node between the first variable resistor and the second variable resistor;

a second current path from a second node between the second variable resistor and the first power supply line to the second power supply line; and a third current path from the first node to the second power supply line, wherein:

the second temperature-dependent characteristic is a characteristic in which a current value of the second current does not change with the predetermined change in temperature;

the second current flows through the first variable resistor, and a fourth current having a current value that is based on a difference between a current value of the first current and a current value of the second current, flows through the second variable resistor;

when the first current is supplied to the second node, a current flowing through the first current path has a current value that is n times the current value of the second current, where n is a positive number excluding 1, and the second current flows through the second current path, and the first current flows through the third current path; and when the third current is supplied to the second node, the current flowing through the first current path has a current value that is n times the current value of the second current, and the second current flows through the second current path, and the third current flows through the third current path.

8. A semiconductor memory device comprising:

a memory cell array; and a voltage generation circuit configured to generate voltages necessary to carry out operations on one or more memory cells of the memory cell array, and to generate a first current having a first temperature-dependent characteristic in which a current value thereof changes with a predetermined change in temperature, a second current having a second temperature-dependent characteristic different from the first temperature-dependent characteristic, and a third current having a third temperature-dependent characteristic in which a current value thereof changes in reverse to the first temperature-dependent characteristic with the predetermined change in temperature, wherein the voltage generation circuit includes:

a first power supply line to which a first power supply voltage is supplied;

a second power supply line to which a second power supply voltage lower than the first power supply voltage is supplied;

a first variable resistor and a second variable resistor connected in series;

a first current path from the first power supply line to a first node between the first variable resistor and the second variable resistor; and a second current path from a second node between the second variable resistor and the first power supply line to the second power supply line, wherein:

the second temperature-dependent characteristic is a characteristic in which a current value of the second current does not change with the predetermined change in temperature;

the second current flows through the first variable resistor, and a fourth current having a current value that is based on a difference between a current value of the first current and a current value of the second current, flows through the second variable resistor;

when a current supplied to the first node through the first current path is the first current, the first current also flows through the second current path, and when the current supplied to the first node through the first current path is the third current, the third current also flows through the second current path.

\* \* \* \* \*